(12) United States Patent
Li

(10) Patent No.: US 10,770,514 B1
(45) Date of Patent: Sep. 8, 2020

(54) DISPLAY PANEL, DISPLAY METHOD AND DISPLAY DEVICE

(71) Applicant: Shanghai Tianma Micro-Electronics Co., Ltd., Shanghai (CN)

(72) Inventor: Jialing Li, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 16/687,192

(22) Filed: Nov. 18, 2019

(30) Foreign Application Priority Data

May 30, 2019 (CN) .......................... 2019 1 0464867

(51) Int. Cl.
*H01L 27/32* (2006.01)
*G02F 1/13363* (2006.01)

(52) U.S. Cl.
CPC ...... *H01L 27/3218* (2013.01); *G02F 1/13363* (2013.01); *G02F 2201/52* (2013.01)

(58) Field of Classification Search
CPC ............. G02F 1/13363; G02F 2201/52; H01L 27/3218
See application file for complete search history.

(56) References Cited

U.S. PATENT DOCUMENTS

| | | | |
|---|---|---|---|
| 6,243,055 B1* | 6/2001 | Fergason | G02B 5/3083 345/32 |
| 2015/0085228 A1* | 3/2015 | Kang | G02F 1/13363 349/98 |
| 2020/0033672 A1* | 1/2020 | Leister | G03H 1/2294 |
| 2020/0089061 A1* | 3/2020 | Wang | G02F 1/133636 |

\* cited by examiner

*Primary Examiner* — Allan R Wilson
(74) *Attorney, Agent, or Firm* — Miller, Matthias & Hull LLP

(57) ABSTRACT

Provided are a display panel, a display method and a display device. The display panel includes a substrate, a display function layer and at least two image motion units. The display function layer is disposed on one side of the substrate and includes a plurality of sub-pixels. The at least two image motion units are disposed on a light-emitting side of the display panel and sequentially arranged in a direction perpendicular to a plane where the substrate is located. The display panel requires a frame unit to display a display picture, and the frame unit includes at least three subframes.

21 Claims, 20 Drawing Sheets

DISPLAY PANEL, DISPLAY METHOD AND DISPLAY DEVICE

CROSS-REFERENCE TO RELATED APPLICATIONS

This application claims priority to Chinese patent application No. 201910464867.5 filed on May 30, 2019, the disclosure of which is incorporated herein by reference in its entirety.

TECHNICAL FIELD

The present disclosure relates to display techniques and, in particular, to a display panel, a display method and a display device.

BACKGROUND

As is known to all, a display panel with higher resolution displays a clearer image and provides people with abetter display experience. With the development of display techniques and an increasing demand for consumer electronic products, people have an increasing demand for high-resolution display panels. In the related art, a color display is generally produced by a display which is provided with approximately one third of its sub-pixels emitting red light, one third of its sub-pixels emitting green light and one third of its sub-pixels emitting blue light. Every three sub-pixels in each group constitute an RGB pixel group. RGB pixel groups are programmed to emit red, green and blue light for the color display.

Each sub-pixel can merely emit light of one color and the light emitted by the pixel group including three RGB sub-pixels is superimposed to perform the color display. However, both a sub-pixel size and a distance between sub-pixels are small in the related art. Therefore, it is difficult to increase the resolution by reducing the sub-pixel size or the distance between sub-pixels. For example, in virtual reality (VR) and augmented reality (AR) applications, a small distance between a display device and the eyes of the user easily results in graininess during viewing, affecting user experience. Therefore, it is necessary to implement a display with higher resolution.

SUMMARY

Embodiments of the present disclosure provide a display panel, a display method and a display device to implement a high-resolution display.

In a first aspect, an embodiment of the present disclosure provides a display panel, including: a substrate; a display function layer disposed on one side of the substrate, and the display function layer includes a plurality of sub-pixels; and at least two image motion units, disposed on a light-emitting side of the display panel and sequentially arranged in a direction perpendicular to a plane where the substrate is located.

A frame unit is used for the display panel to display a display picture, and the frame unit includes at least three subframes. When the display picture of the display panel is switched from a current subframe to a next subframe, the at least two image motion units are configured to move an outgoing position of outgoing light of at least one of the plurality of sub-pixels at the next subframe to an outgoing position of another sub-pixel emitting a different color of light at the current subframe.

In a second aspect, an embodiment of the present disclosure further provides a display method applicable to any display panel described in the first aspect. The display method includes steps described below.

A frame unit of a display picture is divided into at least three subframes.

When the display picture of the display panel is switched from a current subframe to a next subframe, the at least two image motion units are configured to move an outgoing position of outgoing light of at least one of the plurality of sub-pixels at the next subframe to an outgoing position of another pixel emitting a different color of light at the current subframe.

In a third aspect, an embodiment of the present disclosure further provides a display device including any display panel described in the first aspect.

The display panel provided by the embodiments of the present disclosure includes the substrate, the display function layer and the at least two image motion units. The display function layer is disposed on one side of the substrate and includes the plurality of sub-pixels. The at least two image motion units are disposed on the light-emitting side of the display panel and sequentially arranged in the direction perpendicular to the plane where the substrate is located. The display panel requires the frame unit to display the display picture, and the frame unit includes the at least three subframes. When the display picture of the display panel is switched from the current subframe to the next subframe, the image motion units are configured to move the outgoing position of the outgoing light of at least one sub-pixel to the outgoing position of another sub-pixel emitting the different color of light at the current subframe. The display function layer includes the plurality of sub-pixels, such as red, green and blue (RGB) sub-pixels to display a color picture, and the frame unit is divided into the at least three subframes. When the display picture is switched from the current subframe to the next subframe, the image motion units are configured to move the outgoing position of the outgoing light of at least one sub-pixel to the outgoing position of another sub-pixel emitting the different color of light at the current subframe, so that when a display of the frame unit is finished, the outgoing position of each sub-pixel includes light of sub-pixels emitting all colors of light, that is, the at least three subframes respectively emit at least three different colors of light at the same light-emitting position of the display panel. Therefore, each sub-pixel may form a virtual pixel capable of emitting white light, thereby significantly improving a display resolution of the display panel and improving a display result.

DETAILED DESCRIPTION

Figure 1:
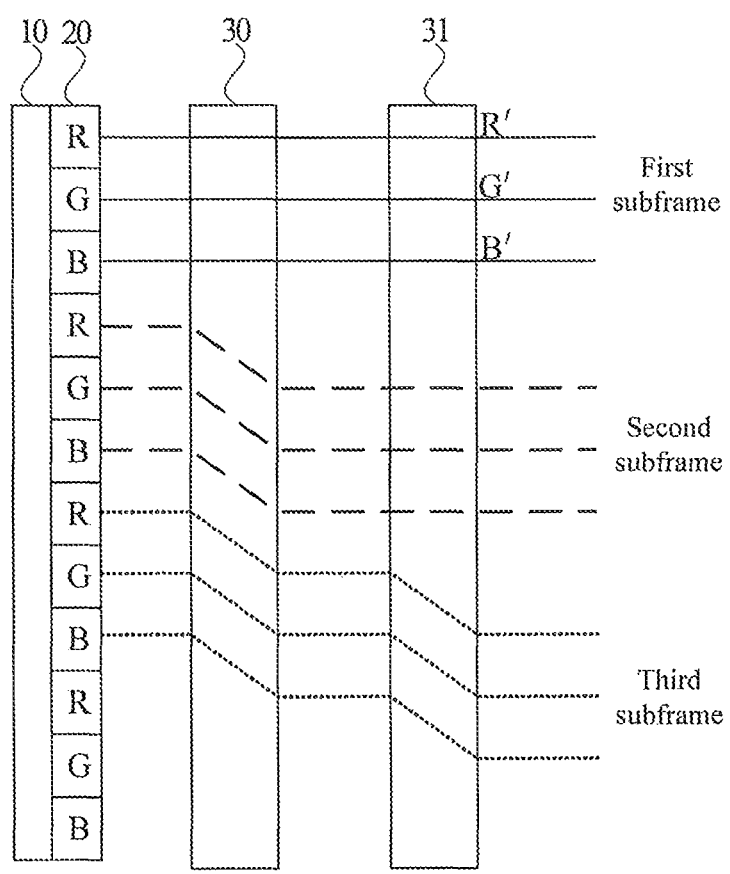
FIG. 1 is a structural diagram of a display panel according to an embodiment of the present disclosure.

Hereinafter the present disclosure will be further described in detail in conjunction with the drawings and embodiments. It is to be understood that the specific embodiments set forth below are intended to illustrate and not to limit the present disclosure. Additionally, it is to be noted that, for ease of description, merely part, not all, of the structures related to the present disclosure are illustrated in the drawings.

Terms used in the embodiments of the present disclosure are merely used to describe specific embodiments and not intended to limit the present disclosure. It is to be noted that spatially related terms, including "on", "below", "left" and "right" used in the embodiments of the present disclosure, are described from the perspective of the drawings, and are not to be construed as a limitation to the present disclosure. In addition, in the context, it is to be understood that when a component is formed "on" or "below" another component, the component may not only be directly formed "on" or "below" another component, and may also be indirectly formed "on" or "below" another component via an intermediate component. The terms "first", "second" and the like are merely used for description and used to distinguish different components rather than indicate any order, quantity, or importance. For those skilled in the art, the preceding terms can be construed depending on specific contexts.

An embodiment of the present disclosure provides a display panel. The display panel includes a substrate, a display function layer and at least two image motion units. The display function layer is disposed on one side of the substrate and includes a plurality of sub-pixels. The at least two image motion units are disposed on a light-emitting side of the display panel and sequentially arranged in a direction perpendicular to a plane where the substrate is located. The display panel requires a frame unit to display a display picture, and the frame unit includes at least three subframes. When the display picture of the display panel is switched from a current subframe to a next subframe, the image motion units are configured to move an outgoing position of outgoing light of at least one sub-pixel at the next subframe to an outgoing position of another sub-pixel emitting a different color of light at the current subframe.

It is to be understood that the display function layer includes sub-pixels emitting at least three different colors of light. Optionally, the plurality of sub-pixels include light-emitting units of N colors, and the display panel includes N−1 image motion units, where N is an integer greater than or equal to 3. For example, the plurality of sub-pixels may include red (R) sub-pixels, green (R) sub-pixels and blue (B) sub-pixels or may include the red (R) sub-pixels, the green (R) sub-pixels, the blue (B) sub-pixels and white (W) sub-pixels. The display panel may be an active light-emitting display panel such as an organic light-emitting diode (OLED) display panel, or may be a liquid crystal display panel which filters light using a color filter. The image motion units may change light-emitting paths of the sub-pixels using a light refraction principle, thereby changing outgoing positions of the sub-pixels. When a conventional display panel displays a picture, the display picture includes one frame unit, and a plurality of frame units (for example, 24 frames) are continuously displayed to form a motion picture. In this embodiment, the display frame includes the frame unit, and the frame unit is divided into at least three subframes. Three subframes form the same display picture, where the current subframe and the next subframe are two adjacent subframes in the same frame unit.

Exemplarily, an example in which the display panel includes the sub-pixels emitting three colors, RGB, of light and the frame unit is divided into three subframes is used. FIG. 1 is a structural diagram of a display panel according to an embodiment of the present disclosure. With reference to FIG. 1, the display panel in this embodiment includes a substrate 10, a display function layer 20 and two image motion units 30 and 31. The display function layer 20 is disposed on one side of the substrate 10 and includes red sub-pixels R, green sub-pixels G and blue sub-pixels B. The two image motion units 30 and 31 are disposed on a light-emitting side of the display panel and sequentially arranged in a direction perpendicular to a plane where the substrate 10 is located. The display panel requires a frame unit to display a display picture, and the frame unit is divided into three subframes. When a first subframe is displayed, the image motion units 30 and 31 do not move an outgoing position of outgoing light of a sub-pixel (a light-emitting direction of the sub-pixel is indicated by a solid line in FIG. 1 and for convenience of illustration, outgoing lights for different subframes are schematically illustrated on different groups of sub-pixels), i.e. the outgoing position of the outgoing light has a correspondence to a position of the sub-pixel emitting the light or a sub-pixel emitting the same color of light on the display panel. Optionally, the preceding correspondence is a one-to-one correspondence, that is, an image of the sub-pixel displayed at the outgoing position corresponds to a practical sub-pixel. It is to be understood that the one-to-one correspondence between the image and the practical subpixel means that projections of the image and the practical subpixel overlap in a direction perpendicular to the display panel. When a second subframe is displayed, the image motion unit 30 moves an outgoing position of outgoing light of each sub-pixel downward by a distance of one sub-pixel in FIG. 1, and the image motion unit 31 does not move the outgoing position of the outgoing light of each sub-pixel (indicated by a long dashed line in FIG. 1). It is to be noted that the image motion unit is configured to move a light-emitting position of one sub-pixel to a light-emitting position of another sub-pixel emitting a different color of light. The light-emitting position here refers to a position of outgoing light on a light-emitting surface of the image motion unit farthest from the display function layer, wherein a vertical projection of the position on the display function layer corresponds to a sub-pixel emitting the outgoing light. For example, R', G' and B' in FIG. 1 are respectively light-emitting positions of R, G and B sub-pixels. Taking the embodiment shown in FIG. 1 as an example, a light-emitting position of the red sub-pixel R is moved to a light-emitting position of the green sub-pixel G, the light-emitting position of the green sub-pixel G is moved to a light-emitting position of the blue sub-pixel B, and the light-emitting position of the blue sub-pixel B is moved to a light-emitting position of the red sub-pixel R in a next group. Here, an image motion direction from the red sub-pixel R to the green sub-pixel G is schematically shown. In a specific implementation, the image motion direction is a direction from one sub-pixel to another sub-pixel emitting a different color of light on a plane parallel to the substrate. When a third subframe is displayed, the image motion unit 30 moves the outgoing position of each sub-pixel downwards by the distance of one sub-pixel, and the pixel motion unit 31 moves the light downwards by a second distance of one sub-pixel (indicated by a short dashed line in FIG. 1), so that three different colors of light are emitted at the same position of the light-emitting surface of the display panel at the three subframes, and each sub-pixel may form a virtual pixel capable of emitting white light. During viewing, each sub-pixel of the display panel is equivalent to an RGB pixel, thereby improving a display resolution. It is to be understood that in this embodiment, a surface of the image motion unit 31 facing away from light-emitting units may be considered as the light-emitting surface.

It is to be noted that an image motion manner shown in FIG. 1 is merely illustrative, and in a specific implementation, the outgoing position may be moved by a width of several sub-pixels, and a specific image motion direction and sequence are also not limited.

In the technical solution provided by the embodiments of the present disclosure, the display function layer includes a plurality of sub-pixels, such as the red, green and blue (RGB) sub-pixels to display a color picture, and the frame unit is divided into at least three subframes. When the display picture is switched from a current subframe to a next subframe, the image motion units move an outgoing position of outgoing light of at least one sub-pixel to an outgoing position of another sub-pixel emitting a different color of light at the current subframe, so that when a display of the frame unit is finished, the outgoing position of each sub-pixel includes lights of sub-pixels emitting all colors of light, that is, the at least three subframes respectively emit at least three different colors of light at the same light-emitting position of the display panel. Therefore, each sub-pixel may form the virtual pixel capable of emitting the white light, thereby significantly improving the display resolution of the display panel and improving a display result.

Optionally, in the frame unit, when the display picture is switched from the current subframe to the next subframe, the image motion units move outgoing positions of outgoing lights of sub-pixels emitting the same color of light to outgoing positions of adjacent sub-pixels emitting the different color of light at the current subframe.

Exemplarily, with continued reference to FIG. 1, when the display picture is switched from the first subframe to the second subframe, the image motion unit moves an outgoing position of outgoing light of the red sub-pixel R to an outgoing position at the first subframe of the green sub-pixel G, moves the outgoing position of outgoing light of the green sub-pixel G to an outgoing position at the first subframe of the blue sub-pixel B, and moves the outgoing position of outgoing light of the blue sub-pixel B to an outgoing position at the first subframe of the next red sub-pixel R. The outgoing position of the outgoing light is moved to the outgoing position of the adjacent sub-pixel emitting the different color of light at the previous subframe so that an image motion distance may be relatively small, simplifying a structure of the image motion unit and an algorithm with which the frame unit is divided into subframes.

Optionally, in the frame unit, when the display picture is switched from the first subframe to the last subframe, outgoing positions of outgoing lights of all the plurality of sub-pixels move along a first direction, where the first direction is a direction in which one of the plurality of sub-pixels points to an adjacent sub-pixel emitting the different color of light.

Exemplarily, with continued reference to FIG. 1, the outgoing positions of the outgoing lights are all moved downward from the first subframe to the third subframe, so that the two image motion units may have the same structure, thereby simplifying a manufacturing process of the display panel.

Optionally, at least two subframe switches exist in the frame unit, where the outgoing positions of the outgoing light of the plurality of sub-pixels move in opposite directions in two subframe switches of the at least two subframe switches.

Figure 2:
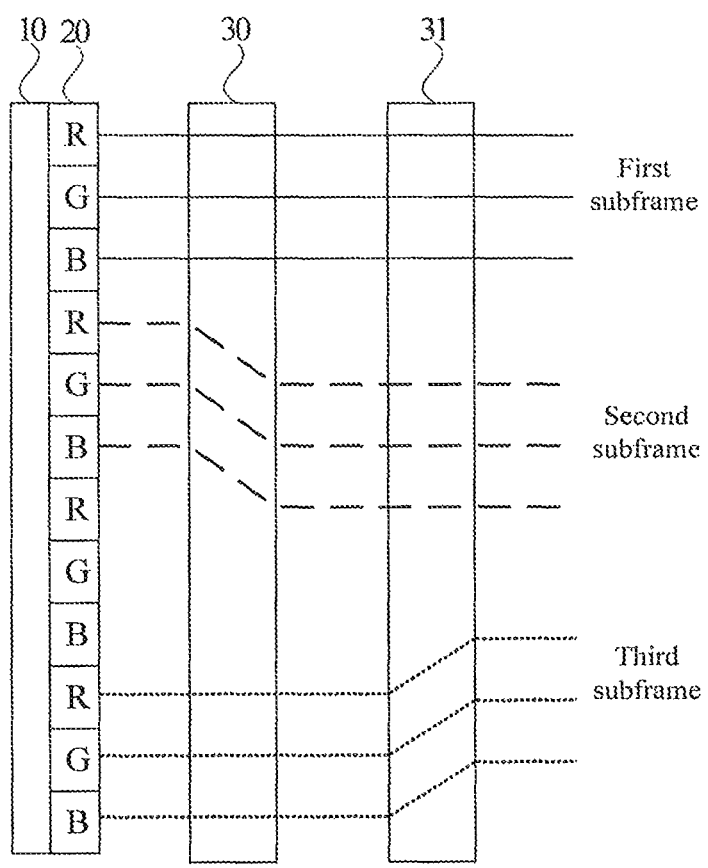
FIG. 2 is a structural diagram of another display panel according to an embodiment of the present disclosure.

Exemplarily, FIG. 2 is a structural diagram of another display panel according to an embodiment of the present disclosure. With reference to FIG. 2, when the first subframe is displayed, the image motion units 30 and 31 do not move the outgoing position of the outgoing light of the sub-pixel (the outgoing direction of the sub-pixel is indicated by a solid line in FIG. 1 and for convenience of illustration, the outgoing lights for different subframes are schematically illustrated on different groups of sub-pixels), i.e. the outgoing position of the outgoing light has the one-to-one correspondence to the position of the sub-pixel emitting the same color of light on the display panel. One subframe switch is performed between the first subframe and the second subframe. When the second subframe is displayed, the image motion unit 30 moves the outgoing position of the outgoing light of each sub-pixel downwards by the distance of one sub-pixel in FIG. 2, and the image motion unit 31 does not move the outgoing position of the outgoing light of each sub-pixel (indicated by a long dashed line in FIG. 2). One subframe switch is performed between the second subframe and the third subframe. When the third subframe is displayed, the image motion unit 30 does not move the outgoing position of the outgoing light of each sub-pixel and the pixel motion unit 31 moves the ray upwards by the distance of one sub-pixel in FIG. 2 (indicated by a short dashed line in FIG. 2). Therefore, three different colors of light are emitted at the same position at the three subframes, and each sub-pixel may form the virtual pixel capable of emitting the white light. During viewing, each sub-pixel of the display panel is equivalent to the RGB pixel, thereby improving the display resolution.

It is to be noted that merely one more image motion unit needs to be disposed for a display panel including sub-pixels emitting four colors of light, which has similar basic principles to the display panel including the sub-pixels emitting three colors of light and is not repeated herein.

Optionally, the plurality of sub-pixels include the red sub-pixels, the green sub-pixels and the blue sub-pixels. The red sub-pixels, the green sub-pixels and the blue sub-pixels are sequentially cycled along a second direction; and sub-pixels arranged along a third direction emit the same color of light; where the second direction intersects the third direction, and the image motion units move the outgoing positions of the outgoing lights of the plurality of sub-pixels along the second direction or a direction opposite to the second direction.

Figure 3:
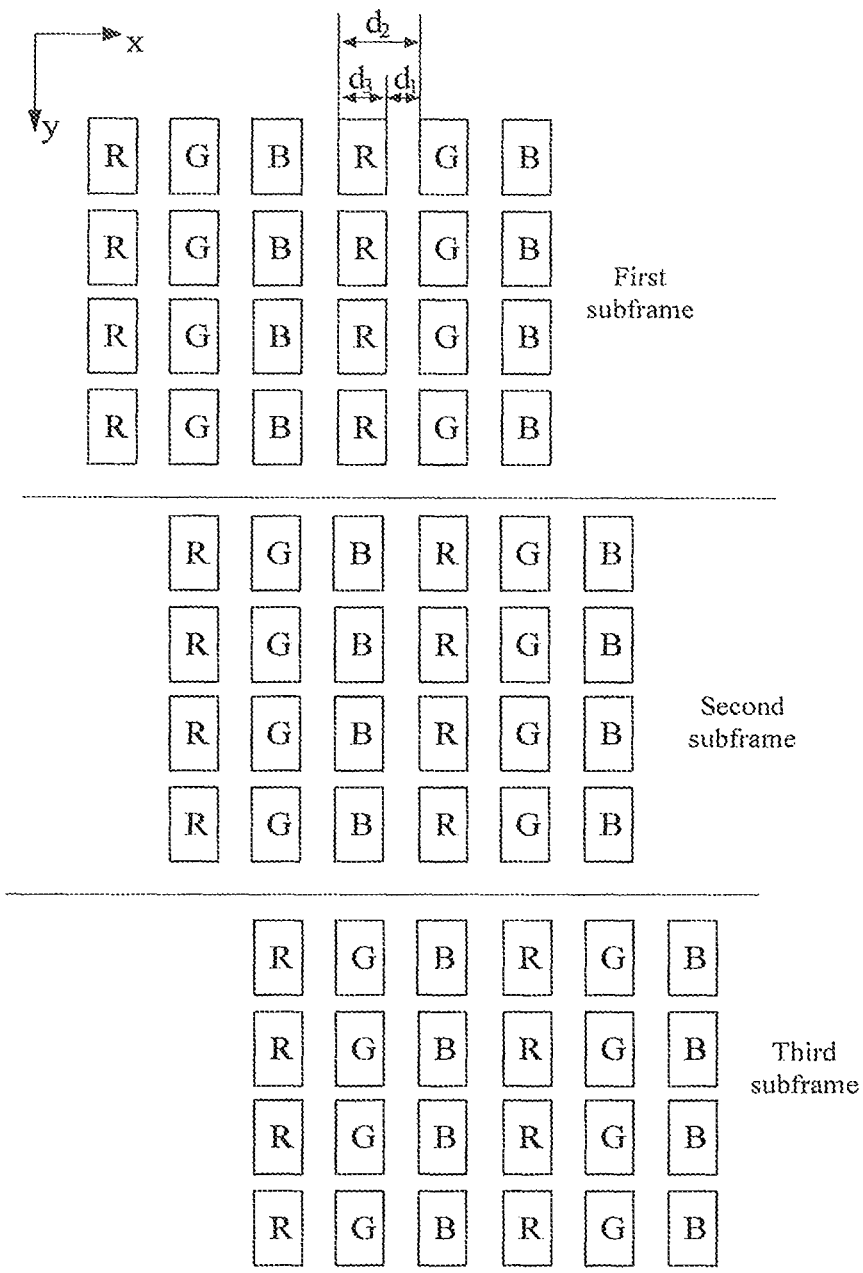
FIG. 3 is a schematic diagram of a pixel arrangement and an image motion of a display panel according to an embodiment of the present disclosure.

Exemplarily, FIG. 3 is a schematic diagram of a pixel arrangement and an image motion of a display panel according to an embodiment of the present disclosure. With reference to FIG. 3, the red sub-pixel R, the green sub-pixel G, and the blue sub-pixel B are sequentially cycled along the second direction x; and the sub-pixels along the third direction y emit the same color of light. The image motion units move the outgoing positions of the outgoing light of the sub-pixels along the second direction x, that is, outgoing positions at the second subframe of a first column of sub-pixels, the red sub-pixels R, are moved to outgoing positions at the first subframe of a second column of sub-pixels, the green sub-pixels G, and outgoing positions at the third subframe of the first column of sub-pixels, the red sub-pixels R, are moved to outgoing positions at the first subframe of a third column of sub-pixels, the blue sub-pixels B. It is to be understood that the image motion units may also move light-emitting directions of the sub-pixels along the direction opposite to the second direction x.

Figure 4:
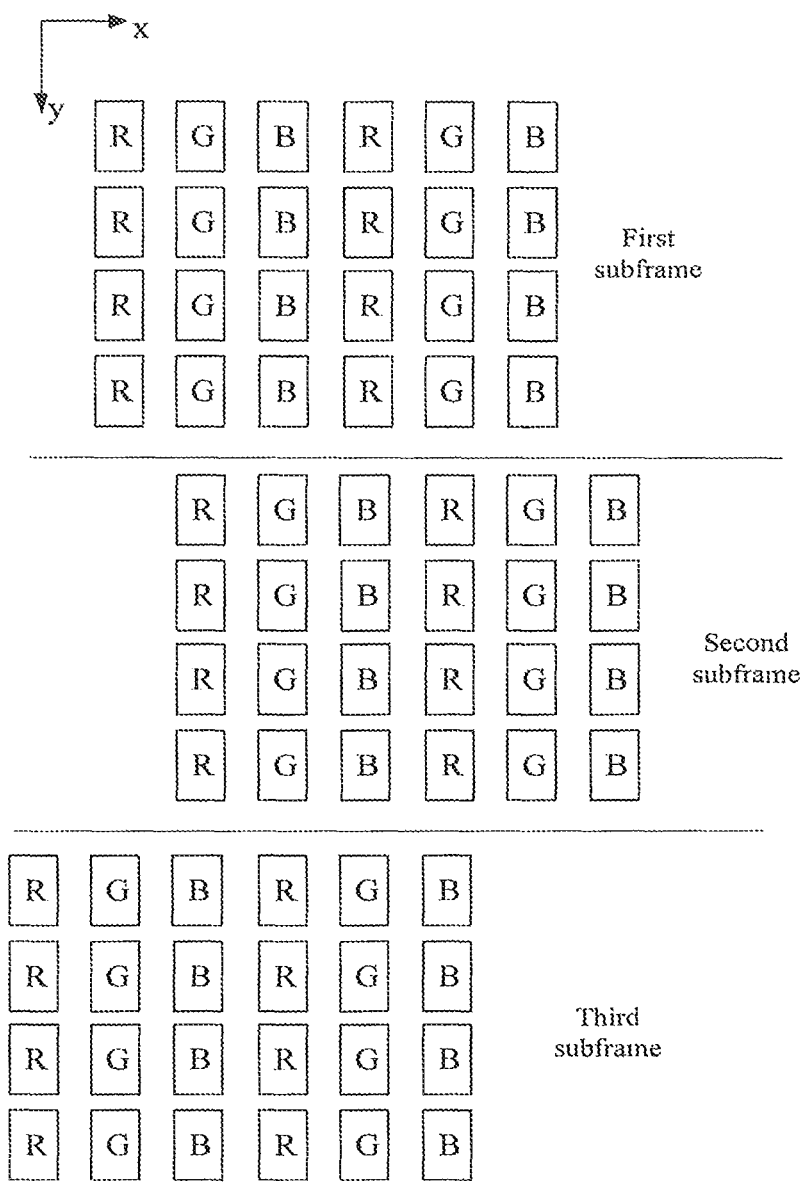
FIG. 4 is a schematic diagram of a pixel arrangement and an image motion of another display panel according to an embodiment of the present disclosure.

FIG. 4 is a schematic diagram of a pixel arrangement and an image motion of another display panel according to an embodiment of the present disclosure. With reference to FIG. 4, the red sub-pixel R, the green sub-pixel G, and the blue sub-pixel B are sequentially cycled along the second direction x; and the sub-pixels along the third direction y emit the same color of light. The outgoing positions at the second subframe of the first column of sub-pixels, the red sub-pixels R, are moved to the outgoing positions at the first subframe of the second column of sub-pixels, the green sub-pixels G, and the outgoing positions at the third subframe of the first column of sub-pixels, the red sub-pixels R, are moved to outgoing positions of a column of blue sub-pixels B (not shown in FIG. 4) on a left side of the first column of sub-pixels, the red sub-pixels R. The image motion units move the outgoing positions of the outgoing lights of the sub-pixels so that lights superimposed at each outgoing position are equivalent to the RGB pixel, improving the display resolution, avoiding a virtual pixel rendering algorithm, and reducing drive complexity.

Figure 5:
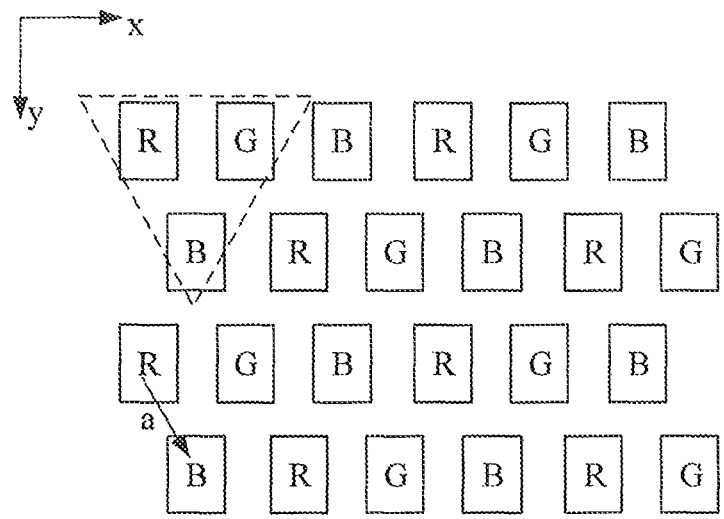
FIG. 5 is a schematic diagram of a pixel arrangement of a display panel according to an embodiment of the present disclosure.

Optionally, FIG. 5 is a schematic diagram of a pixel arrangement of a display panel according to an embodiment of the present disclosure. With reference to FIG. 5, the plurality of sub-pixels include the red sub-pixels R, the green sub-pixels G and the blue sub-pixels B. Along the second direction x, one of the red sub-pixels R is disposed adjacent to another of the red sub-pixels R, one of the green sub-pixels G is disposed adjacent to another of the green sub-pixels G, and one of the blue sub-pixels B is disposed adjacent to another of the blue sub-pixels B. The red sub-pixels R, the green sub-pixels G and the blue sub-pixels B are sequentially cycled along the third direction y, where any one of red sub-pixels R, any one of green sub-pixels G and any one of blue sub-pixels B, which are adjacent to each other, constitute a pixel unit in a triangular shape. The second direction x intersects the third direction y, and the image motion units move the outgoing positions of the outgoing lights of the plurality of sub-pixels along a direction a in which one sub-pixel in the pixel unit points to another sub-pixel in the pixel unit.

In some optional embodiments of the present application, optionally, the plurality of sub-pixels have the same shape, and six sub-pixels emitting the same color of light have a common vertex and are closely arranged to form a subpixel unit in a regular hexagonal shape. Any two adjacent sub-pixel units emit different colors of light. Centers of three adjacent sub-pixel units are connected to form a regular triangle, and three sub-pixels defined by the regular triangle and located in different sub-pixel units constitute a pixel unit.

Figure 6:
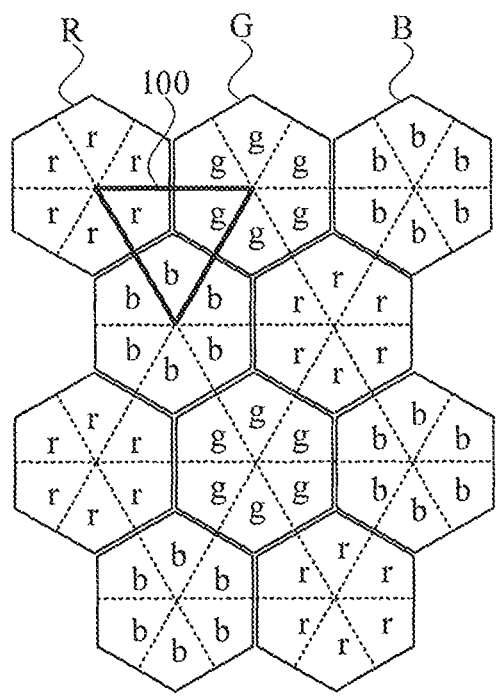
FIG. 6 is a schematic diagram of a pixel arrangement of another display panel according to an embodiment of the present disclosure.

Exemplarily, FIG. 6 is a schematic diagram of a pixel arrangement of another display panel according to an embodiment of the present disclosure. With reference to FIG. 6, six red sub-pixels R of the same shape form a regular hexagonal sub-pixel unit R, six green sub-pixels G of the same shape form a regular hexagonal sub-pixel unit G, and six blue sub-pixels B of the same shape form a regular hexagonal sub-pixel unit B. For each sub-pixel unit, mid-points of each of three pairs of opposite sides of a regular hexagon are connected, i.e., six sub-pixels may be divided. Any two adjacent sub-pixel units emit different colors of light. The centers of the three adjacent sub-pixel units are connected to form the regular triangle, and the three sub-pixels defined by the regular triangle and located in different sub-pixel units constitute a pixel unit 100. In a specific implementation, the six sub-pixels in each sub-pixel unit are separately provided with a corresponding drive circuit, and each sub-pixel independently controls brightness through the corresponding drive circuit. Since an area of each sub-pixel is one sixth of an area of each sub-pixel unit, a resolution of the display panel may be greatly improved by 6 times. Exemplarily, when each sub-pixel includes an organic light-emitting unit, the six sub-pixels in the same sub-pixel unit may share a hexagonal opening unit on a pixel definition layer, so that the sub-pixels emitting the same color of light are concentrated to reduce an alignment accuracy and simplify the manufacturing process.

Optionally, in the frame unit, when the display picture is switched from the current subframe to the next subframe, the image motion units move outgoing positions of outgoing lights of the sub-pixel unit to outgoing positions of an adjacent sub-pixel unit at the current subframe.

Figure 7:
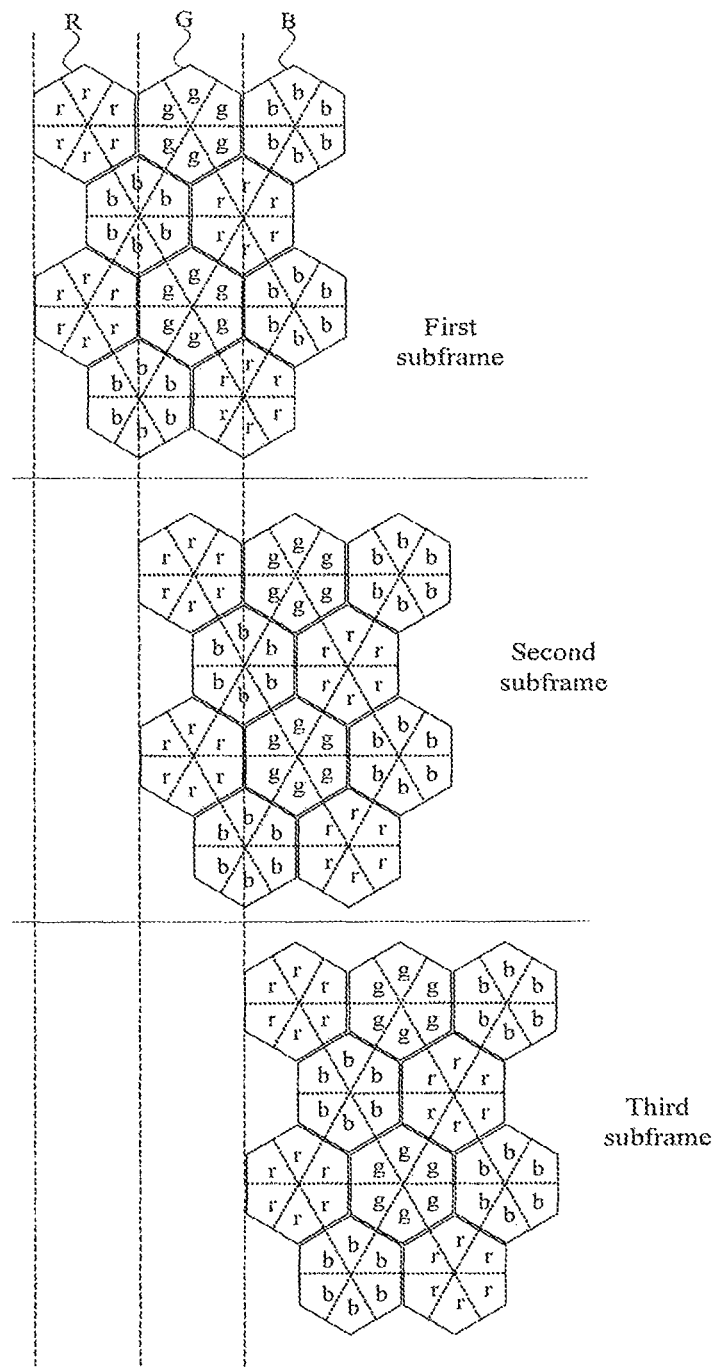
FIG. 7 is a schematic diagram of an image motion of the display panel shown in FIG. 6.
Figure 8:
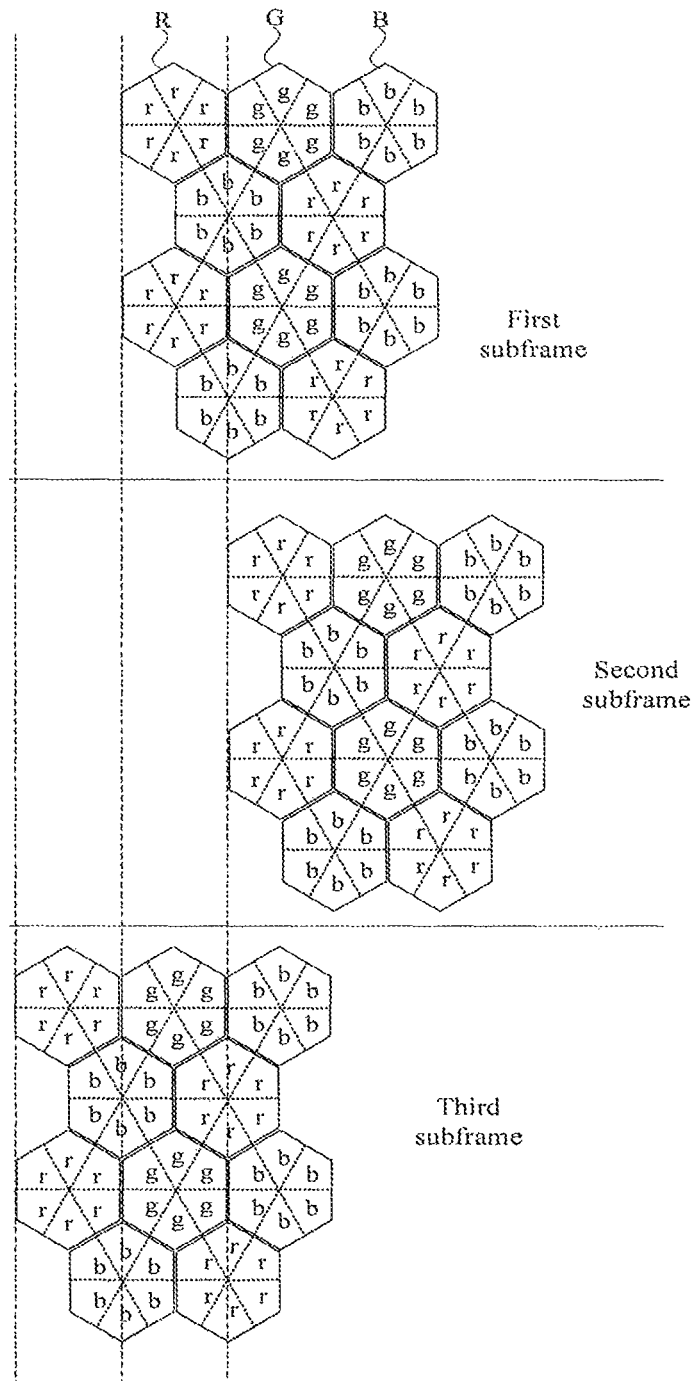
FIG. 8 is a schematic diagram of an image motion of the display panel shown in FIG. 6.

Exemplarily, FIG. 7 is a schematic diagram of an image motion of the display panel shown in FIG. 6; and FIG. 8 is a schematic diagram of an image motion of the display panel shown in FIG. 6. In the embodiments shown in FIG. 7 and FIG. 8, the image motion distance is a width of a hexagonal sub-pixel unit. In conjunction with a pixel arrangement shown in FIG. 6 and image motion manners provided by the embodiments of the present disclosure, a practical sub-pixel density is increased by changing the pixel arrangement, and each sub-pixel forms the RGB pixel through the image motion, further improving a resolution of the display picture of the display panel.

Figure 9:
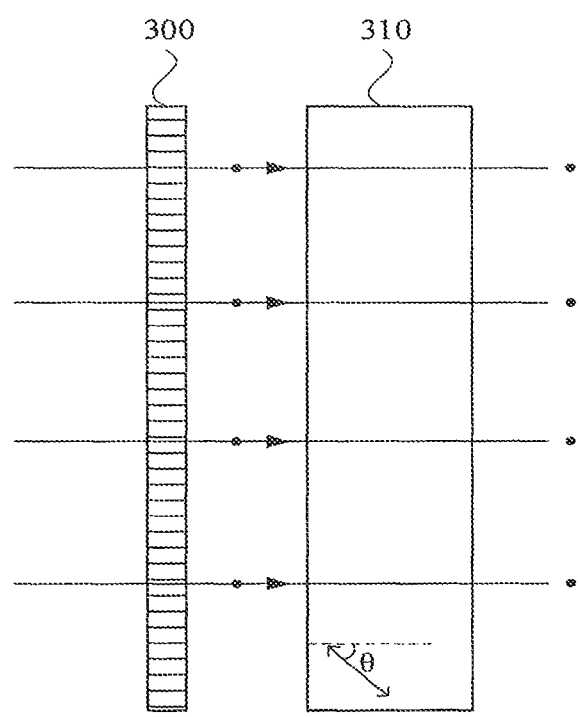
FIG. 9 is a structural diagram of an image motion unit according to an embodiment of the present disclosure.

FIG. 9 is a structural diagram of an image motion unit according to an embodiment of the present disclosure. With reference to FIG. 9, optionally, the image motion unit in this embodiment includes a light valve 300 and a birefringent structure 310. The light valve 300 is switchable between a first state and a second state. The light valve 300 in the first state merely emits first polarized light in a first polarization direction, and the light valve 300 in the second state merely emits second polarized light in a second polarization direction, where the first polarization direction is perpendicular to the second polarization direction. The birefringent structure 310 is disposed on one side of the light valve 300 facing away from the light-emitting surface of the display panel, The birefringent structure 310 does not change an outgoing position of the first polarized light and moves an outgoing position of the second polarized light to an outgoing position of another sub-pixel emitting the different color of light at the current subframe.

Figure 10:
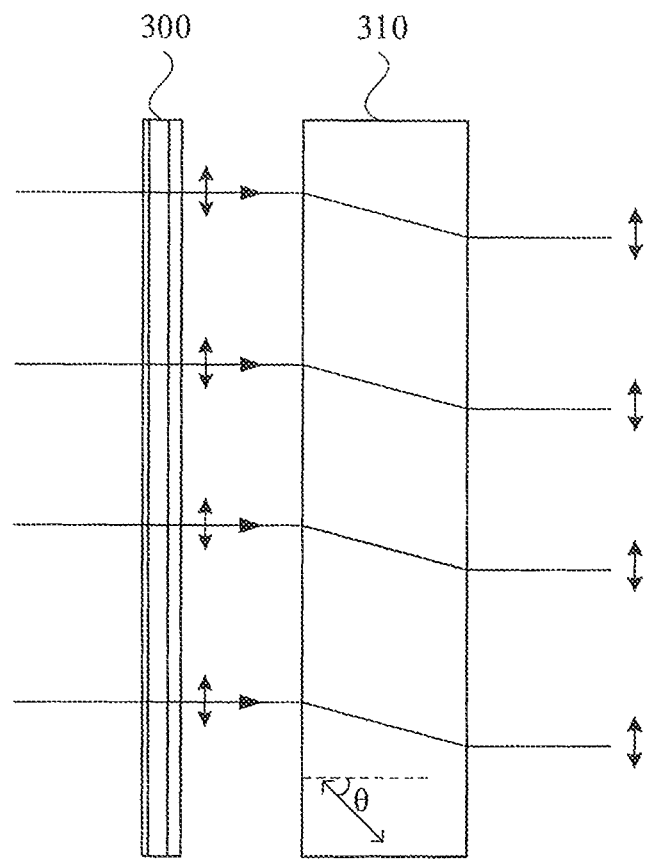
FIG. 10 is a schematic diagram of an optical path of a light value in FIG. 9 in a second state.

It is to be understood that birefringence refers to a phenomenon that a beam of incident light generates two beams of refraction lights. A beam of light is incident into anisotropy crystals (such as quartz and calcite) and decomposed into two kinds of polarized light whose vibration directions are perpendicular to each other and propagation speeds are different. A beam satisfying a law of refraction is called ordinary light and a beam not satisfying the law of refraction is called extraordinary light. Exemplarily, FIG. 9 further shows a schematic diagram of an optical path of the light valve 300 in the first state. FIG. 9 shows a sectional diagram of the image motion unit, where the section is perpendicular to the plane where the substrate is located. A direction of an optical axis of the birefringent structure is shown by a bidirectional arrow in FIG. 9. The direction is parallel to a paper plane and an angle θ between the direction and a horizontal direction (or a direction perpendicular to the display panel) is greater than 0° and less than 90°, for example, 45°. The light valve 300 in the first state merely emits the first polarized light in the first polarization direction. The first polarization direction is perpendicular to the paper plane, that is, the first polarization direction is perpendicular to the direction of the optical axis, so that the first polarized light incident into the birefringent structure 310 is the ordinary light, and its outgoing position is unchanged when the first polarized light is emitted from the birefringent structure 310. FIG. 10 is a schematic diagram of an optical path of the light valve in FIG. 9 in the second state. The light valve 300 in the second state merely emits the second polarized light in the second polarization direction. The second polarization direction is parallel to the light-emitting surface of the display panel and the paper surface, so that the second polarized light incident into the birefringent structure 310 is the extraordinary light, and its outgoing position is moved when the second polarized light is emitted from the birefringent structure 310.

Figure 11:
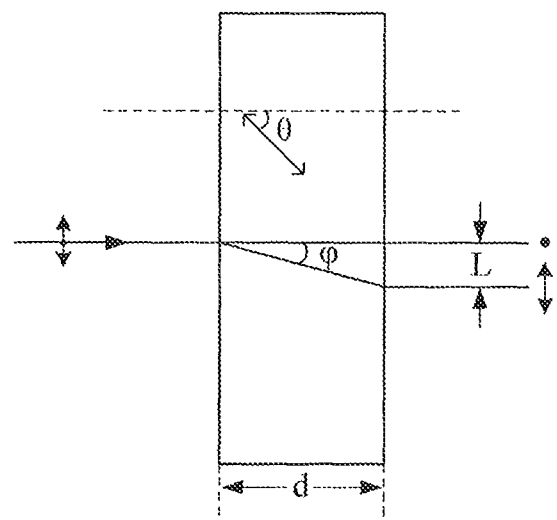
FIG. 11 is a schematic diagram of light propagation in a birefringent structure.

Optionally, FIG. 11 is a schematic diagram of light propagation in the birefringent structure. With reference to FIG. 11, a vertical distance L between an outgoing position of one sub-pixel at the current subframe and an outgoing position of the one sub-pixel at the next subframe satisfies the following relationships:

$$L = d \cdot \tan\varphi;$$

$$\varphi = \theta - \tan^{-1}\left(\frac{n_o^2}{n_e^2}\tan\theta\right);$$

where d denotes a dimension of the birefringent structure in the direction perpendicular to the plane where the substrate is located, φ denotes an angle between the extraordinary light and the ordinary light when the birefringent structure performs the birefringence, θ denotes an angle between the optical axis of the birefringent structure and the direction perpendicular to the plane where the substrate is located, $n_o$ denotes a refractive index of the birefringent structure for the ordinary light, and $n_e$ denotes a refractive index of the birefringent structure for the extraordinary light. The direction of the optical axis of the birefringent structure and a thickness of the birefringent structure are rationally designed to move the outgoing position of the outgoing light to a preset position.

Optionally, the display panel includes two image motion units, and the display function layer includes sub-pixels emitting three different colors of light. Optical axes of birefringent structures in the two image motion units are parallel or symmetrical about a first plane, where the first plane is located in the middle of the birefringent structures in the two image motion units and is parallel to the plane where the substrate is located. The angle between the optical axis of the birefringent structure and the direction perpendicular to the plane where the substrate is located is greater than 0° and less than 90°.

Figure 12:
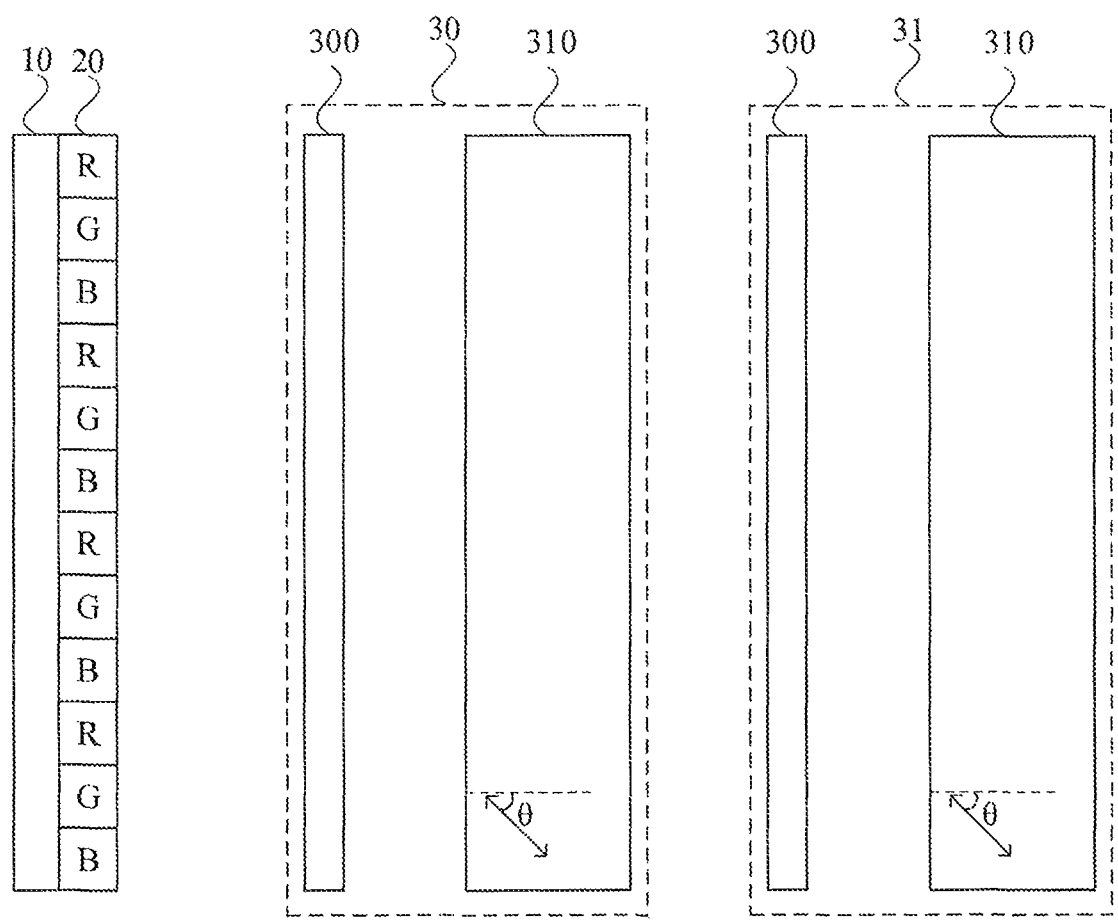
FIG. 12 is a structural diagram of another display panel according to an embodiment of the present disclosure.

Exemplarily, FIG. 12 is a structural diagram of another display panel according to an embodiment of the present disclosure. With reference to FIG. 12, the display panel includes the two image motion units 30 and 31, the display function layer includes the sub-pixels R, G and B emitting three different colors of light. The optical axes of the birefringent structures in the two image motion units are parallel. The angle θ between the optical axes of the birefringent structures and the direction perpendicular to the plane where the substrate is located is greater than 0° and less than 90°.

It is to be understood that when the optical axes of the birefringent structures in the two image motion units are parallel and both the light valves are in the second state, the image motion is performed twice on the outgoing positions of the outgoing lights in the same direction, which is similar to the image motion manner shown in FIG. 3. When the light is incident in the direction of the optical axis, the birefringence does not occur, and when the light is incident in a direction perpendicular to the optical axis, the ordinary light and the extraordinary light have consistent propagation directions and the extraordinary light does not deviate in position; therefore, the outgoing lights of the display panel are perpendicular to the plane where the substrate is located, so that it is necessary to set 0°<θ<90°.

Figure 13:
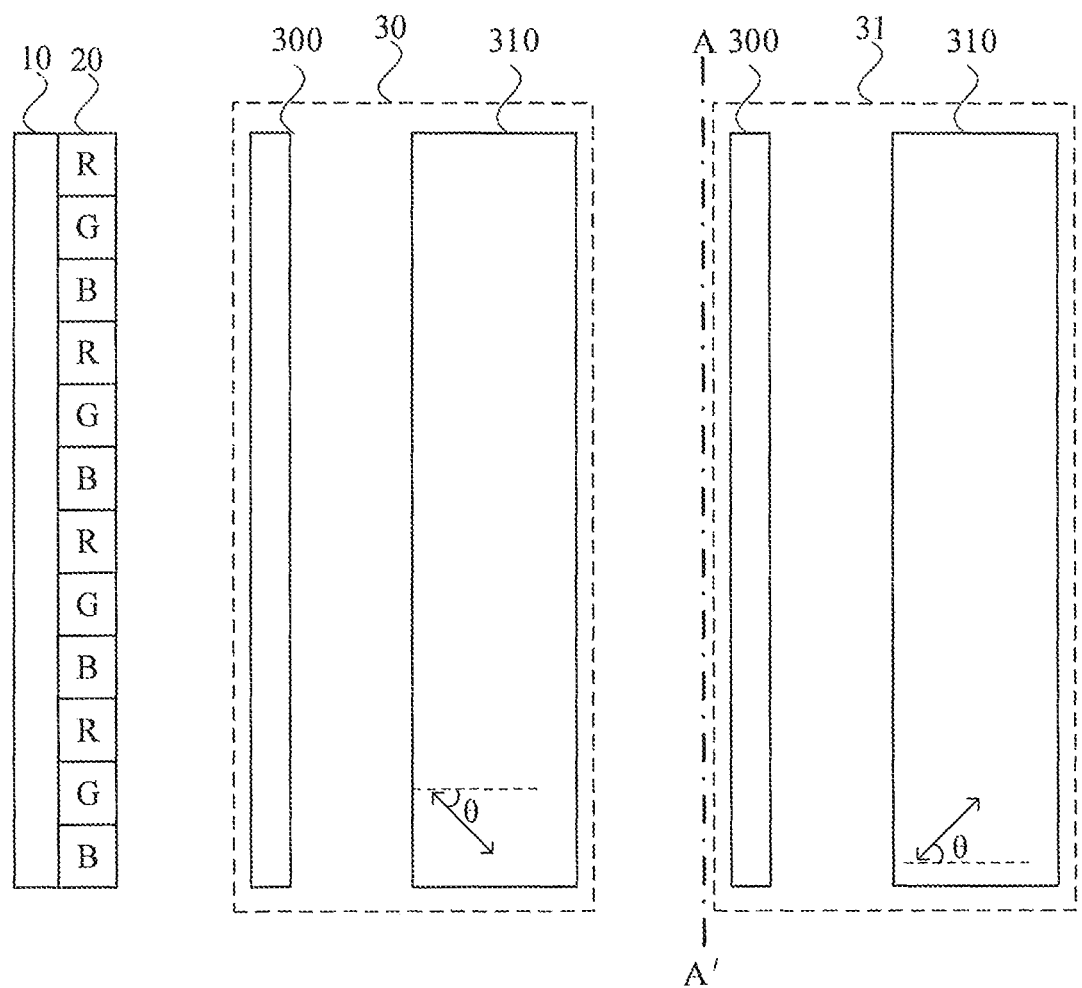
FIG. 13 is a structural diagram of another display panel according to an embodiment of the present disclosure.

FIG. 13 is a structural diagram of another display panel according to an embodiment of the present disclosure. With reference to FIG. 13, the display panel includes the two image motion units 30 and 31, the display function layer includes the sub-pixels R, G and B emitting three different colors of light. The optical axes of the birefringent structures in the two image motion units are symmetrical about a first plane A-A'. The angle θ between the optical axes of the birefringent structures and the direction perpendicular to the plane where the substrate is located is greater than 0° and less than 90°.

It is to be understood that when the optical axes of the birefringent structures in the two image motion units are symmetrical about the first plane A-A', the outgoing lights move in opposite directions after the outgoing lights penetrate through the two image motion units, which is similar to the image motion manner shown in FIG. 4. When the light is incident in the direction of the optical axis, the birefringence does not occur, and when the light is incident in a direction perpendicular to the optical axis, the ordinary light and the extraordinary light have consistent propagation directions and the extraordinary light does not deviate;

therefore, the outgoing lights of the display panel are perpendicular to the plane where the substrate is located, so that it is to be necessary to set $0°<\theta<90°$.

Optionally, optical axes of the birefringent structure in outgoing paths of sub-pixels emitting different colors of light have different directions; or birefringent structures in outgoing paths of the sub-pixels emitting different colors of light have different thicknesses.

It is to be understood that since a birefringent crystal has different refractive indexes for light with different wavelengths, the light with different wavelengths will be dispersed after penetrating through a birefringent material, resulting in different motion distances of lights emitted by the R, G and B sub-pixels. To ensure that all the sub-pixels have a consistent motion distance, the direction of the optical axis of the birefringent structure or the thickness of the birefringent structure may be changed to an area corresponding to a different sub-pixel.

Exemplarily, when the birefringent structure employs a liquid crystal, since $n_R>n_G>n_B$, it is necessary to design $\theta_R<\theta_G<\theta_B$ when the birefringent structure has the same thicknesses in areas. Table 1 shows that when the thickness of the birefringent structure is 62.25 μm and the motion distance of the RGB sub-pixels is required to be 11.2 μm, $\theta_R$, $\theta_G$ and $\theta_B$ are respectively 44.940°, 44.970° and 45.000°.

TABLE 1

| | Image motion parameter | | |
| --- | --- | --- | --- |
| | 11.2 μm | | |
| L | R | G | B |
| θ | 44.940 | 44.970 | 45.000 |
| $n_o$ | 1.490 | 1.490 | 1.490 |
| $n_e$ | 1.790 | 1.789 | 1.788 |
| Δn | 0.300 | 0.299 | 0.298 |
| tanθ | 1 | 1 | 1 |
| $n_o^2/n_e^2$ | 0.693 | 0.694 | 0.694 |
| arctan | 34.718 | 34.748 | 34.778 |
| θ | 10.222 | 10.222 | 10.222 |
| tanφ | 0.180 | 0.180 | 0.180 |
| d | 62.25 | 62.25 | 62.25 |

Exemplarily, when the birefringent structure employs the liquid crystal, since $n_R>n_G>n_B$, when the birefringent structure has the same optical axis angle in the areas, it is necessary to design $d_R<d_G<d_B$ to ensure the same motion distance of the outgoing positions of the outgoing lights of all the sub-pixels.

Figure 14:
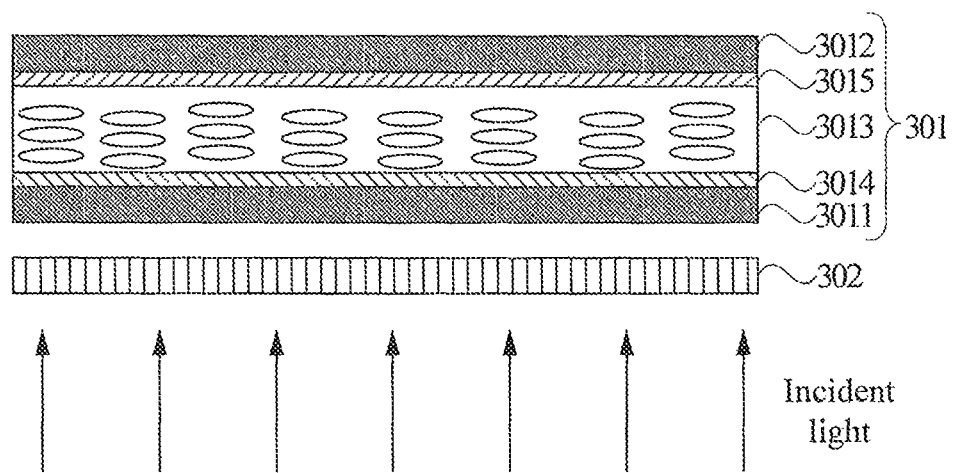
FIG. 14 is a structural diagram of a light value according to an embodiment of the present disclosure.

FIG. 14 is a structural diagram of a light valve according to an embodiment of the present disclosure. With reference to FIG. 14, optionally, the light valve includes a twisted nematic liquid crystal cell 301 and a polarizer 302. The twisted nematic liquid crystal cell 301 includes a first substrate 3011, a second substrate 3012 and a twisted nematic liquid crystal layer 3013 between the first substrate 3011 and the second substrate 3012, a first electrode 3014 disposed on one side of the first substrate 3011 and a second electrode 3015 disposed on one side of the second substrate 3012. The polarizer 302 is disposed on one side of the twisted nematic liquid crystal cell 301 facing away from the birefringent structure.

It is to be understood that when a voltage is applied across a twisted nematic liquid crystal, liquid crystal molecules may twist compared with the absence of the voltage, so as to modulate a polarization direction of the light. In a specific implementation, for example, when no voltage is applied between the first electrode 3014 and the second electrode 3015, the light valve may be in the first state, so that a polarization state of the outgoing light of the display panel is deflected to the first polarization direction. When a fixed voltage (not equal to 0) is applied between the first electrode 3014 and the second electrode 3015, the light valve is in the second state, so that the polarization state of the outgoing light of the display panel is deflected to the second polarization direction. Exemplarily, when the light valve shown in FIG. 14 is used in the embodiment shown in FIG. 13, the polarizer 302 is parallel to the substrate and disposed on the side of the light valve facing the display function layer.

It is to be understood that when the display panel is the liquid crystal display panel, the light valve may not include the polarizer since a polarizer has been disposed on a light-emitting surface of the display function layer. After the light penetrates through a first image motion unit, the outgoing light is linearly polarized light, so the light valve in the image motion unit closest to the display function layer may also cancel the polarizer. Optionally, the light valve in the image motion unit closest to the display function layer may include the twisted nematic liquid crystal cell 301 and not include the polarizer 302 in FIG. 14. After polarized light emitted by the liquid crystal display panel penetrates through a liquid crystal cell of a first light valve, polarized light in the first polarization direction or the second polarization direction may be obtained as required.

When the display panel is an organic light-emitting display panel, the outgoing light of the display function layer includes components in the first polarization direction and the second polarization direction, so the polarizer of the light valve in the image motion unit closest to the display function layer cannot be omitted, i.e., the light valve in the image motion unit closest to the display function layer has the structure shown in FIG. 14.

In addition, it is to be noted that after the ray penetrates through the image motion unit closest to the display function layer, the outgoing light is polarized light, so the light valves in the subsequent image motion unit may cancel the polarizer and merely include the twisted nematic liquid crystal cell, thereby simplifying the structure of the display panel.

Optionally, the display panel is the organic light-emitting display panel, and the light valve in the image motion unit closest to the display function layer includes a linear polarizer and a rotation unit. The rotation unit is configured to drive the linear polarizer to rotate around a geometric center of the rotation unit on a plane where the linear polarizer is located, to polarize light transmitted through the linear polarizer into the birefringent structure in the first polarization direction or in the second polarization direction.

It is to be understood that the organic light-emitting display panel actively emits light, and an upper polarizer and a lower polarizer similar to a liquid crystal display are not required to be disposed. The outgoing light of the organic light-emitting display panel includes the components in the first polarization direction and the second polarization direction, so the light valve in the image motion unit closest to the display function layer may include the linear polarizer and the rotation unit. The rotation unit drives the linear polarizer to rotate around the geometric center of the rotation unit on the plane where the linear polarizer is located until a polarization direction is parallel to the first polarization direction when the light valve is in the first state, or until the polarization direction is parallel to the second polarization direction when the light valve is in the second state. That is, the first image motion unit through which the outgoing light penetrates may not be provided with the twisted nematic liquid crystal cell to thin the display panel.

Optionally, in some embodiments, when the outgoing light penetrates through a second image motion unit, the light needs to be switched between a first polarization state and a second polarization state, so as to control an image motion state of the light through the birefringent structure. In this case, the twisted nematic liquid crystal cell may be employed to change the polarization direction of the light.

In some optional embodiments of the present application, optionally, a distance $d_1$ between adjacent sub-pixels and a subpixel period d2 satisfy $0 \leq d_1/d_2 \leq 50.9$, where $d_1$ denotes a distance between adjacent sides of the adjacent sub-pixels, and d2 denotes a sum of $d_1$ and a width of one sub-pixel in an extension direction of $d_1$.

It is to be understood that with continued reference to FIG. 3, the sub-pixel period $d_2$ is a sum of a width $d_3$ of one sub-pixel and a blank area $d_1$ adjacent to the one sub-pixel. In this embodiment, the outgoing position of the outgoing light of one sub-pixel is moved to the outgoing position of the outgoing light of another sub-pixel emitting the different color of light, and $d_1$ may be set to be 0% to 90% of $d_2$. For example, when $d_2$=30 μm, $d_1$ may be between 0 μm and 27 μm. The blank area may not be disposed in theory to improve a density of the sub-pixels and the resolution of the display panel.

Figure 15:
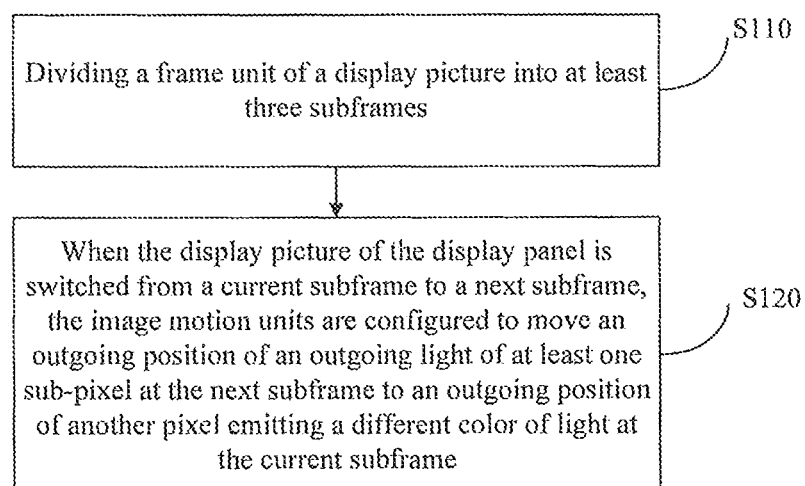
FIG. 15 is a flowchart of a display method according to an embodiment of the present disclosure.

FIG. 15 is a flowchart of a display method according to an embodiment of the present disclosure. The display method in this embodiment is applicable to any display panel according to the embodiments described above. The method includes steps described below.

In step S110, a frame unit of a display picture is divided into at least three subframes.

In step S120, when the display picture of the display panel is switched from a current subframe to a next subframe, image motion units move an outgoing position of an outgoing light of at least one sub-pixel at the next subframe to an outgoing position of another pixel emitting a different color of light at the current subframe.

It is to be understood that the display panel includes sub-pixels emitting at least three different colors of light. For example, the display panel may include red (R) sub-pixels, green (R) sub-pixels and blue (B) sub-pixels, or may include the red (R) sub-pixels, the green (R) sub-pixels, the blue (B) sub-pixels and white (W) sub-pixels. The image motion units may change light-emitting paths of the sub-pixels using a light refraction principle, thereby changing outgoing positions of the sub-pixels. In this embodiment, the display frame includes the frame unit, and the frame unit is divided into at least three subframes. Three subframes form the same display picture, where the current subframe and the next subframe are two adjacent subframes in the same frame unit.

In the display method provided by the embodiment of the present disclosure, the frame unit is divided into at least three subframes: when the display picture is switched from the current subframe to the next subframe, the image motion units move the outgoing position of the outgoing light of at least one sub-pixel to the outgoing position of another sub-pixel emitting the different color of light at the current subframe, so that when a display of the frame unit is finished, the outgoing position of each sub-pixel includes lights of sub-pixels emitting all colors of light, that is, the at least three subframes respectively emit at least three different colors of light at the same light-emitting position of the display panel. Therefore, each sub-pixel may form a virtual pixel capable of emitting white light, thereby significantly improving a display resolution of the display panel and improving a display result.

Optionally, a display function layer includes sub-pixels emitting three different colors of light, and the display panel includes two image motion units. Each of the two image motion units includes a light valve and a birefringent structure. Optical axes of birefringent structures in the two image motion units are parallel. The light valve is switchable between a first state and a second state, where the light valve in the first state merely emits first polarized light in a first polarization direction, and the light valve in the second state merely emits second polarized light in a second polarization direction, where the first polarization direction is perpendicular to the second polarization direction. The birefringent structure is disposed on one side of the light valve facing away from a light-emitting side of the display panel, does not change an outgoing position of the first polarized light and moves an outgoing position of the second polarized light to an outgoing position of another sub-pixel emitting the different color of light at the current subframe.

The method includes steps described below.

The frame unit of the display picture is divided into three subframes.

When a first subframe is displayed, light valves in the two image motion units are controlled to be in the first state.

When a second subframe is displayed, a light valve in one of the two image motion units is controlled to be in the first state, and a light valve in the other one of the two image motion units is controlled to be in the second state.

When a third subframe is displayed, the light valves in the two image motion units are controlled to be in the second state.

Figure 16:
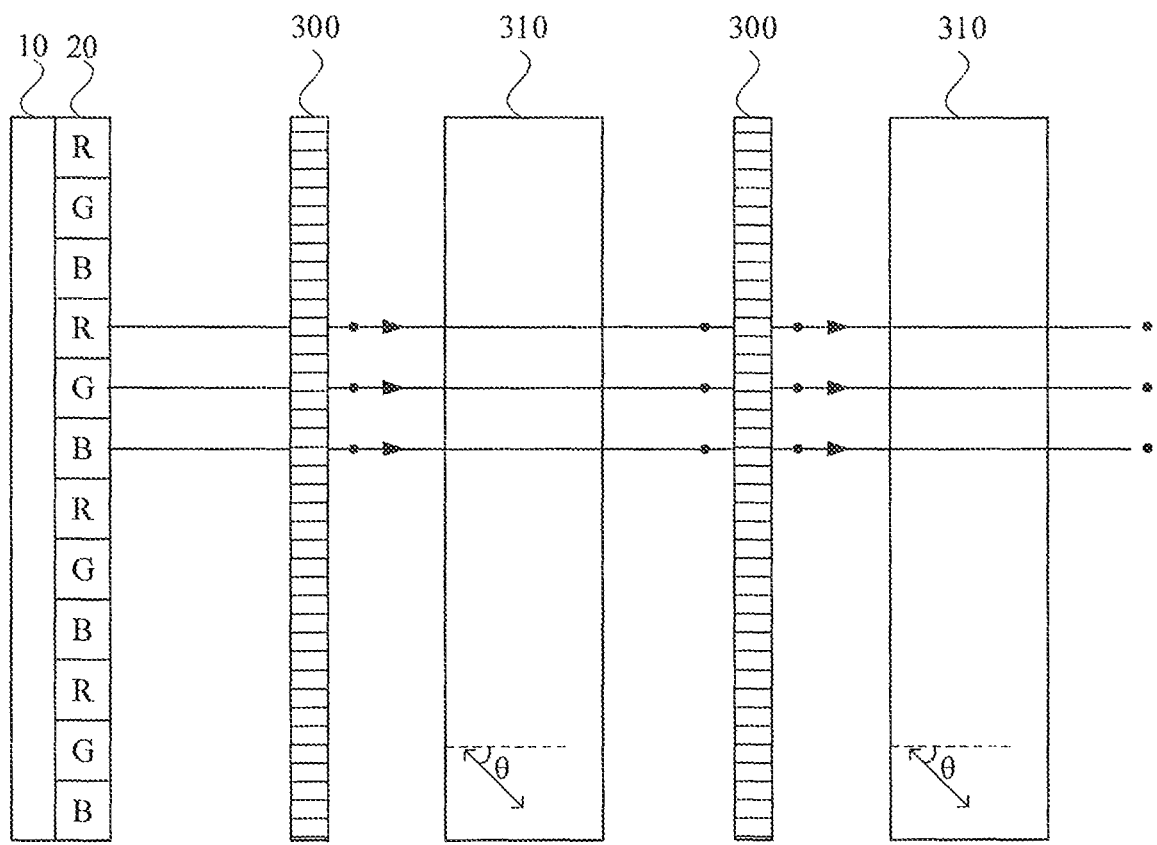
FIG. 16 to FIG. 18 are respectively schematic diagrams of optical paths from a first subframe to a third subframe according to embodiments of the present disclosure.
Figure 17:
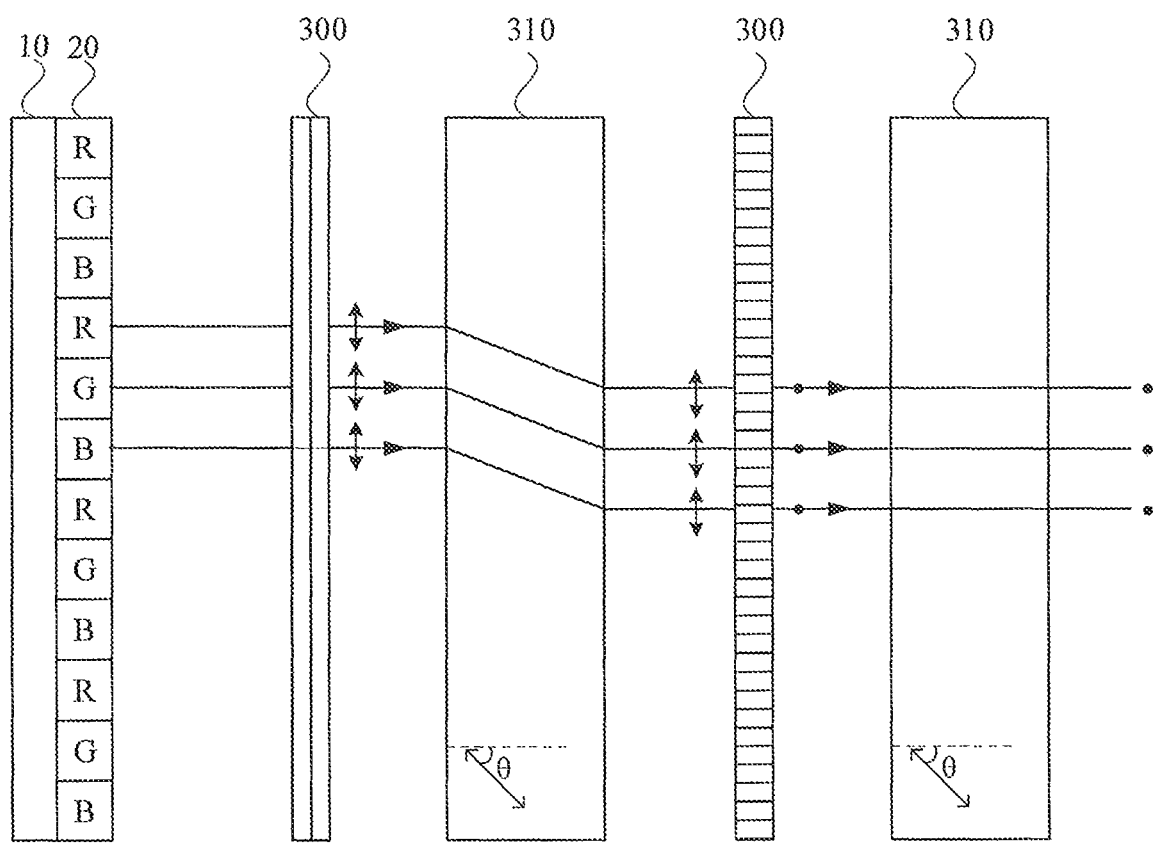
Figure 18:
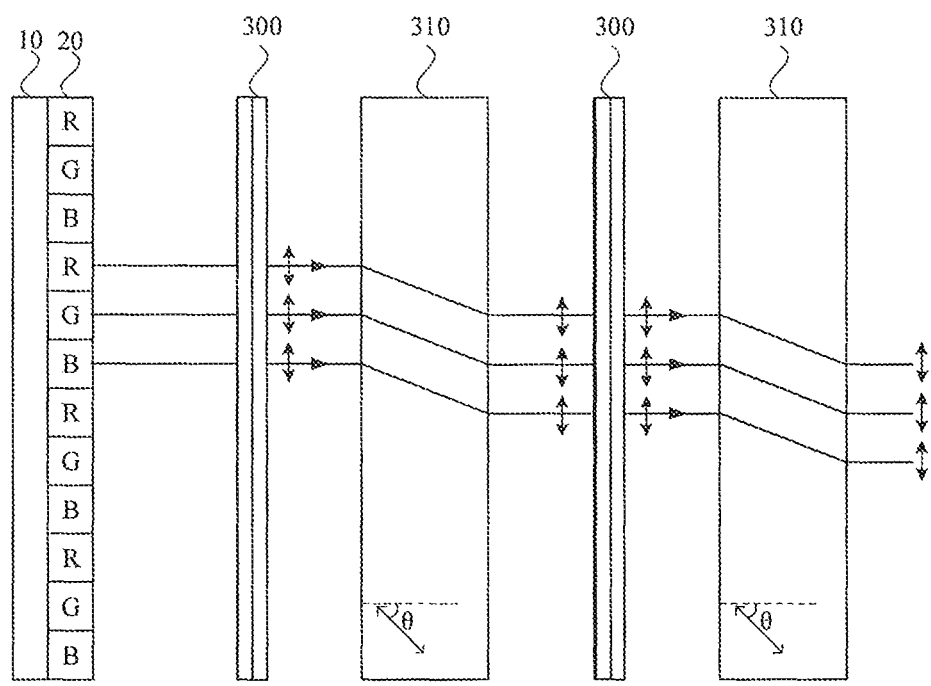

It is to be understood that this embodiment is applicable to the display panel shown in FIG. 12. FIG. 16 to FIG. 18 are respectively schematic diagrams of optical paths from a first subframe to a third subframe according to embodiments of the present disclosure. With reference to FIG. 16, at the first subframe, both the light valves 300 in the two image motion units are in the first state, and emit the first polarized light in the first polarization direction. Since the first polarized light is an ordinary light when it is propagated in the birefringent structure 310, birefringence does not occur, and the outgoing position is not moved. With reference to FIG. 17, at a second subframe, the light valve 300 in one of the two image motion units is controlled to be in the first state, and the light valve 300 in the other image motion unit is controlled to be in the second state (FIG. 17 schematically shows that the light valve 300 on a right side is in the first state, and the light valve 300 on a left side is in the second state, and in a specific implementation, the light valve 300 on the left may be in the first state, and the light valve 300 on the right side may be in the second state). Since the first polarized light is the ordinary light when it is propagated in the birefringent structure 310, the birefringence does not occur, and the outgoing position is not moved. Since the second polarized light is an extraordinary light when it is propagated in the birefringent structure 310, the birefringence occurs, and the outgoing position is moved. In this way, the outgoing position is moved once. With reference to FIG. 18, at the third subframe, both the light valves 300 in the two image motion units are controlled to be in the second state, so that the outgoing position is moved twice.

Optionally, the display function layer includes the sub-pixels emitting three different colors of light, and the display panel includes the two image motion units. Each of the two image motion units includes the light valve and the birefringent structure. The optical axes of the birefringent structures in the two image motion units are symmetrical about a first plane, where the first plane is located in the middle of the birefringent structures in the two image motion units and is parallel to a plane where a substrate is located. An angle between the optical axes of the birefringent structures and a direction perpendicular to the plane where the substrate is located is greater than 0° and less than 90°. The light valve is switchable between the first state and the second state, where the light valve in the first state merely emits the first polarized light in the first polarization direction, and the light valve in the second state merely emits the second polarized light in the second polarization direction, where the first polarization direction is perpendicular to the second polarization direction. The birefringent structure is disposed on a light-emitting side of the light valve, does not change the outgoing position of the first polarized light and moves the outgoing position of the second polarized light to the outgoing position of another sub-pixel emitting the different color of light at the current subframe.

The method includes steps described below.

The frame unit of the display picture is divided into three subframes.

In condition that the first subframe is displayed, both the light valves in the two image motion units are controlled to be in the first state.

In condition that the second subframe is displayed, the light valve in one of the two image motion units is controlled to be in the first state, and the light valve in the other one of the two image motion units is controlled to be in the second state.

In condition that the third subframe is displayed, the light valve in the one of the two image motion units is controlled to be in the first state, and the light valve in the other one of the two image motion units is controlled to be in the second state; wherein the same light valve is in different states at the second subframe and the third subframe.

Figure 19:
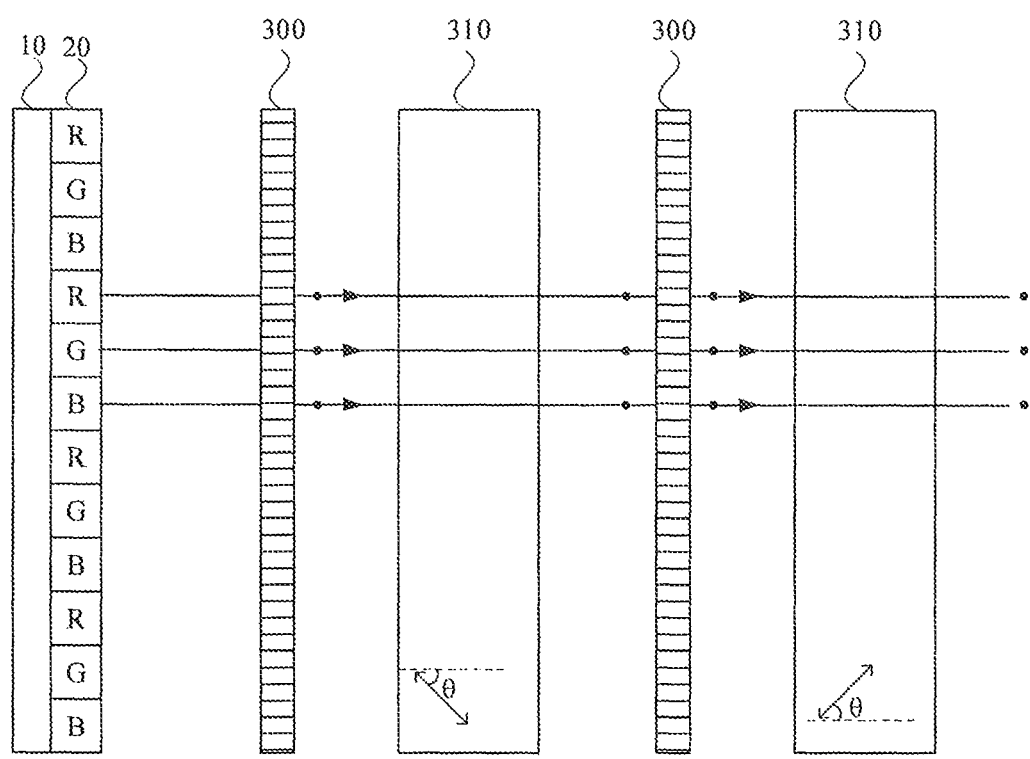
FIG. 19 to FIG. 21 are respectively schematic diagrams of another optical paths from a first subframe to a third subframe according to embodiments of the present disclosure.
Figure 20:
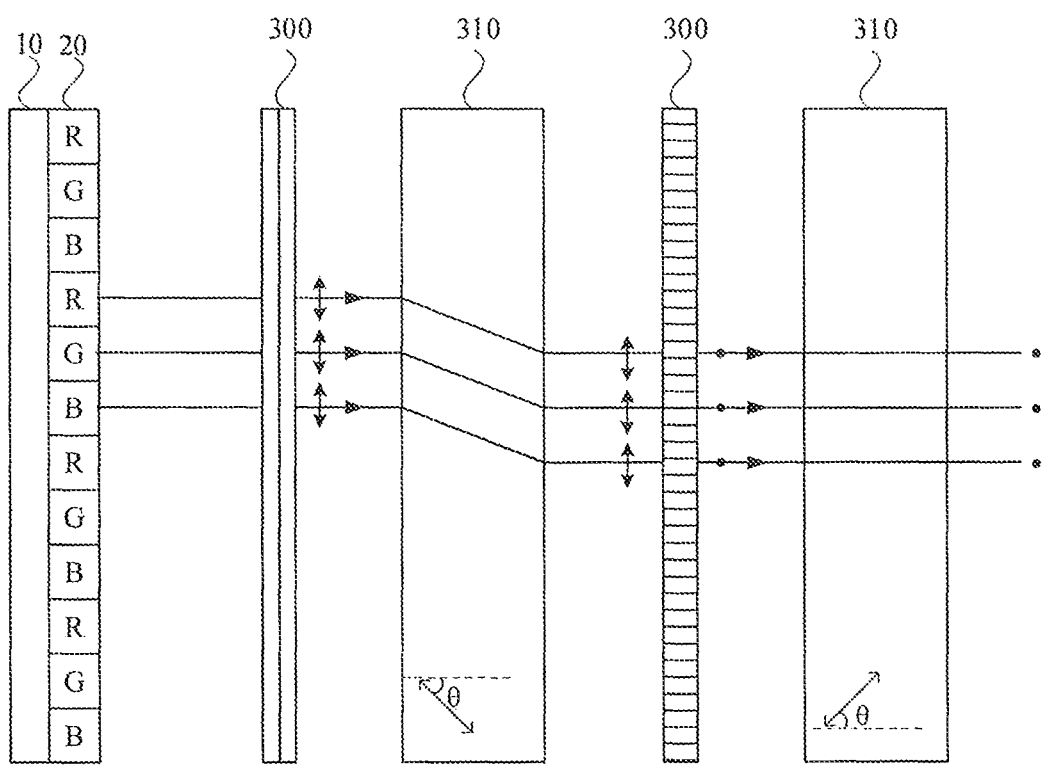
Figure 21:
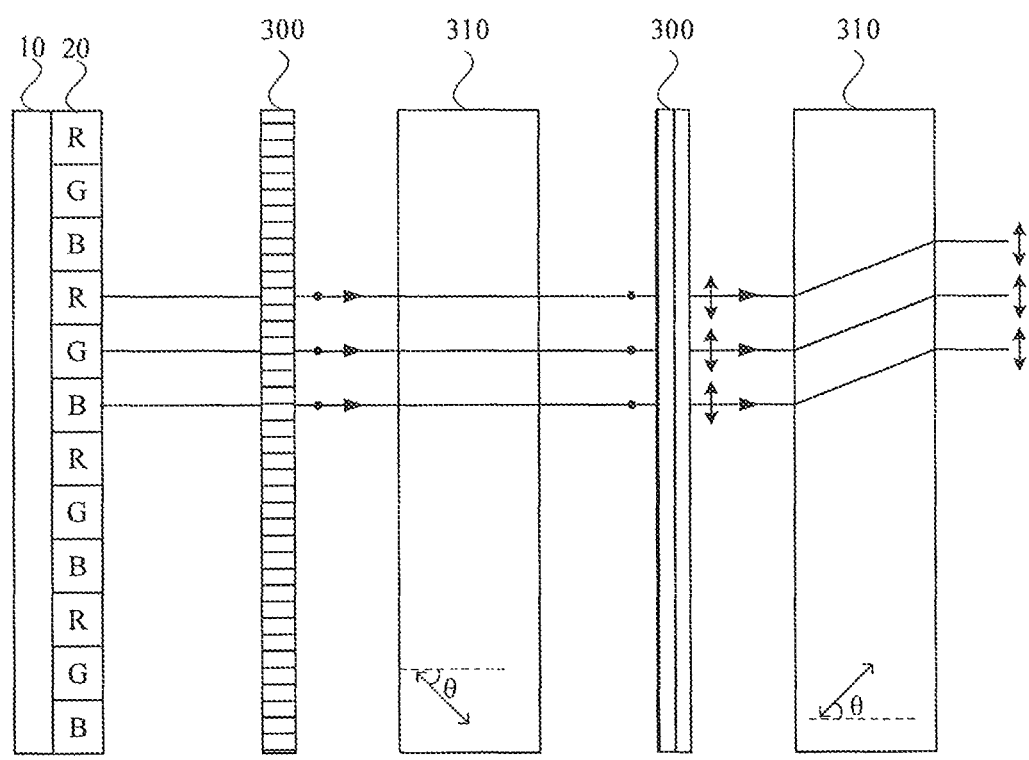

It is to be understood that this embodiment is applicable to the display panel shown in FIG. 13. FIG. 19 to FIG. 21 are respectively schematic diagrams of another optical paths from a first subframe to a third subframe according to embodiments of the present disclosure. With reference to FIG. 19, at the first subframe, both the light valves 300 in the two image motion units are in the first state, and emit the first polarized light in the first polarization direction. Since the first polarized light is the ordinary light when it is propagated in the birefringent structure 310, the birefringence does not occur, and the outgoing position is not moved. With reference to FIG. 20, at the second subframe, the light valve 300 in one of the two image motion units is controlled to be in the first state, and the light valve 300 in the other image motion unit is controlled to be in the second state (the light valve 300 on the right side is in the first state, and the light valve 300 on the left side is in the second state). Since the second polarized light is the extraordinary light when it is propagated in the birefringent structure 310, the birefringence occurs, and the outgoing position is moved. In conjunction with a direction of an optical axis of the light valve 300 on the left side, the outgoing position is moved downwards. With reference to FIG. 21, at the third subframe, the light valve 300 on the left side is controlled to be in the first state, and the light valve 300 on the right side is controlled to be in the second state; and the outgoing position is moved upwards in conjunction with a direction of an optical axis of the light valve 300 on the right side. In a specific implementation, a state in FIG. 20 and a state in FIG. 21 may be interchanged.

Optionally, the display function layer includes sub-pixels emitting four different colors of light, and the display panel includes three image motion units. Each of the three image motion units includes the light valve and the birefringent structure. Optical axes of birefringent structures in the three image motion units are parallel. The light valve is switchable between the first state and the second state, where the light valve in the first state merely emits the first polarized light in the first polarization direction, and the light valve in the second state merely emits the second polarized light in the second polarization direction, where the first polarization direction is perpendicular to the second polarization direction. The birefringent structure is disposed on the light-emitting side of the light valve, does not change the outgoing position of the first polarized light and moves the outgoing position of the second polarized light to the outgoing position of another sub-pixel emitting the different color of light at the current subframe.

The method includes steps described below.

The frame unit of the display picture is divided into four subframes.

In condition that the first subframe is displayed, all light valves in the three image motion units are controlled to be in the first state.

In condition that the second subframe is displayed, a light valve in one of the three image motion units is controlled to be in the first state, and light valves in the other two of the two image motion units is controlled to be in the second state.

In condition that the third subframe is displayed, light valves in two of the three image motion units is controlled to be in the first state, and a light valve in the other one of the two image motion units is controlled to be in the second state.

In condition that a fourth subframe is displayed, all the light valves in the three image motion units are controlled to be in the second state.

It is to be understood that the display panel including the sub-pixels emitting four colors of light has similar image motion principles to the display panel including the sub-pixels emitting three colors of light, which are not repeated herein.

Figure 22:
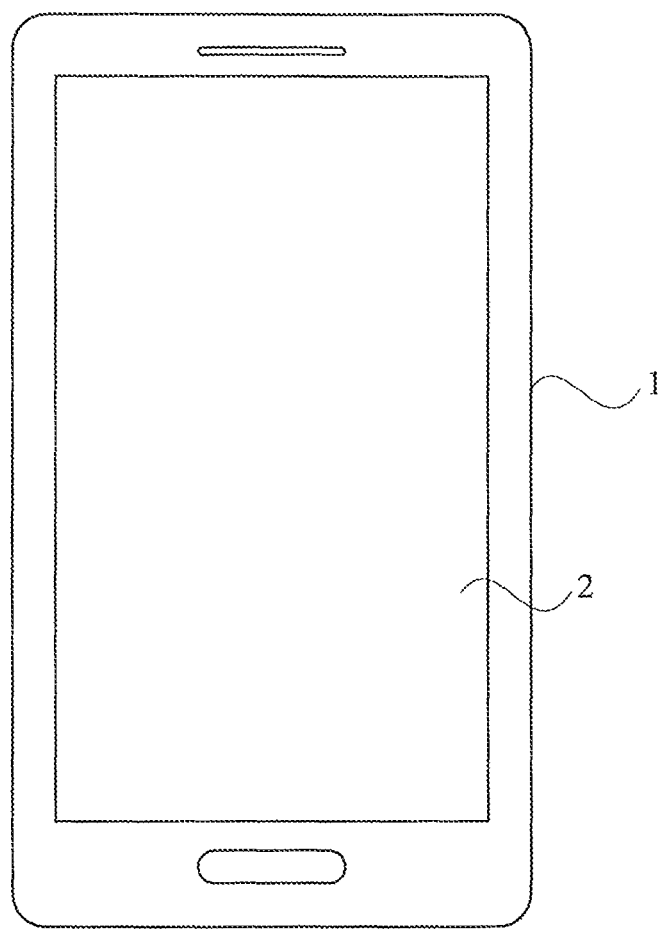
FIG. 22 is a structural diagram of a display device according to an embodiment of the present disclosure.

FIG. 22 is a structural diagram of a display device according to an embodiment of the present disclosure. Referring to FIG. 22, the display device 1 includes the display panel 2 according to any embodiment of the present disclosure. The display device 1 may specifically be a mobile phone, a computer, a virtual reality apparatus and the like. Since the display device in this embodiment includes the display panel according to any embodiment described above, the device panel has the same and corresponding technical effects with the display panel.

It is to be noted that the above are merely preferred embodiments of the present disclosure and the technical principles used therein. It can be understood by those skilled in the art that the present disclosure is not limited to the specific embodiments described herein. Those skilled in the art can make various apparent modifications, adaptations, combinations and substitutions without departing from the scope of the present disclosure. Therefore, while the present disclosure has been described in detail through the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. A display panel, comprising:
   a substrate;

a display function layer disposed on one side of the substrate, and wherein the display function layer comprises a plurality of sub-pixels; and at least two image motion units, disposed on a light-emitting side of the display panel and sequentially arranged in a direction perpendicular to a plane where the substrate is located;

wherein a frame unit is used for the display panel to display a display picture, and the frame unit comprises at least three subframes: wherein when the display picture of the display panel is switched from a current subframe to a next subframe, the at least two image motion units are configured to move an outgoing position of an outgoing light of at least one of the plurality of sub-pixels to an outgoing position of another sub-pixel emitting a different color of light at the current subframe.

2. The display panel of claim 1, wherein in the frame unit, when the display picture is switched from the current subframe to the next subframe, the at least two image motion units are configured to move outgoing positions of outgoing light of sub-pixels emitting a same color of light to outgoing positions of adjacent sub-pixels emitting the different color of light at the current subframe.

3. The display panel of claim 1, wherein in the frame unit, when the display picture is switched from a first subframe to a last subframe, outgoing positions of outgoing light of all the plurality of sub-pixels move along a first direction, wherein the first direction is a direction in which one of the plurality of sub-pixels points to an adjacent sub-pixel emitting the different color of light.

4. The display panel of claim 1, wherein at least two subframe switches exist in the frame unit, wherein outgoing positions of outgoing light of the plurality of sub-pixels move in opposite directions in two subframe switches of the at least two subframe switches.

5. The display panel of claim 1, wherein the plurality of sub-pixels comprise red sub-pixels, green sub-pixels and blue sub-pixels, wherein the red sub-pixels, the green sub-pixels and the blue sub-pixels are sequentially cycled along a second direction; and sub-pixels arranged along a third direction emit a same color of light;

wherein the second direction intersects the third direction, and the at least two image motion units are configured to move outgoing positions of outgoing light of the plurality of sub-pixels along the second direction or a direction opposite to the second direction.

6. The display panel of claim 1, wherein the plurality of sub-pixels comprise red sub-pixels, green sub-pixels and blue sub-pixels, wherein along a second direction, one of the red sub-pixels is disposed adjacent to another of the red sub-pixels, one of the green sub-pixels is disposed adjacent to another of the green sub-pixels, and one of the blue sub-pixels is disposed adjacent to another of the blue sub-pixels; and wherein the red sub-pixels, the green sub-pixels and the blue sub-pixels are sequentially cycled along a third direction, wherein any one of the red sub-pixels, any one of the green sub-pixels and any one of blue sub-pixel, which are adjacent to each other, constitute a pixel unit in a triangular shape;

wherein the second direction intersects the third direction, and the at least two image motion units are configured to move outgoing positions of outgoing light of the plurality of sub-pixels along a direction in which one sub-pixel in the pixel unit points to another sub-pixel in the pixel unit.

7. The display panel of claim 1, wherein the plurality of sub-pixels have a same shape, and six sub-pixels emitting a same color of light have a common vertex and are closely arranged to form a subpixel unit in a regular hexagonal shape;

wherein any two adjacent sub-pixel units emit different colors of light; and centers of three adjacent sub-pixel units are connected to form a regular triangle, and three sub-pixels defined by the regular triangle and located in different sub-pixel units constitute a pixel unit.

8. The display panel of claim 7, wherein in the frame unit, when the display picture is switched from the current subframe to the next subframe, the at least two image motion units are configured to move outgoing positions of outgoing light of the sub-pixel unit to outgoing positions of an adjacent sub-pixel unit at the current subframe.

9. The display panel of claim 1, wherein each of the at least two image motion units comprises:

a light valve, wherein the light valve is switchable between a first state and a second state, wherein first polarized light in a first polarization direction passes through the light valve in the first state, and second polarized light in a second polarization direction passes through the light valve in the second state, wherein the first polarization direction is perpendicular to the second polarization direction; and a birefringent structure disposed on one side of the light valve facing away from a light-emitting surface of the display panel, wherein the birefringent structure does not change an outgoing position of the first polarized light and is configured to move an outgoing position of the second polarized light to an outgoing position of another sub-pixel emitting the different color of light at the current subframe.

10. The display panel of claim 9, wherein the display panel comprises two image motion units, and the display function layer comprises the plurality of sub-pixels emitting three different colors of light; wherein optical axes of birefringent structures in the two image motion units are parallel or symmetrical about a first plane, wherein the first plane is located in the middle of the birefringent structures in the two image motion units and is parallel to the plane where the substrate is located; and an angle between the optical axe of the birefringent structure and the direction perpendicular to the plane where the substrate is located is greater than 0 degrees and less than 90 degrees.

11. The display panel of claim 9, wherein optical axes of the birefringent structure in outgoing paths of sub-pixels emitting different colors of light have different directions; or birefringent structures in outgoing paths of sub-pixels emitting different colors of light have different thicknesses.

12. The display panel of claim 9, wherein the light valve comprises a twisted nematic liquid crystal cell and a polarizer; wherein the twisted nematic liquid crystal cell comprises:

a first substrate, a second substrate and a twisted nematic liquid crystal layer disposed between the first substrate and the second substrate;

a first electrode, disposed on one side of the first substrate;

a second electrode, disposed on one side of the second substrate; and the polarizer is disposed on one side of the twisted nematic liquid crystal cell facing away from the birefringent structure.

13. The display panel of claim 9, wherein the display panel is an organic light-emitting display panel, and the light valve in one of the image motion units closest to the display function layer comprises a linear polarizer and a rotation unit, wherein the rotation unit is configured to drive the linear polarizer to rotate around a geometric center of the rotation unit on a plane where the linear polarizer is located, to polarize light transmitted through the linear polarizer into the birefringent structure in the first polarization direction or in the second polarization direction.

14. The display panel of claim 9, wherein a vertical distance L between an outgoing position of one sub-pixel at the current subframe and an outgoing position of the one sub-pixel at the next subframe satisfies the following relationships:

$$L = d \cdot \tan\varphi;$$
$$\varphi = \theta - \tan^{-1}\left(\frac{n_o^2}{n_e^2}\tan\theta\right);$$

wherein d denotes a dimension of the birefringent structure in the direction perpendicular to the plane where the substrate is located, $\varphi$ denotes an angle between extraordinary light and ordinary light when the birefringent structure performs birefringence, $\theta$ denotes an angle between an optical axis of the birefringent structure and the direction perpendicular to the plane where the substrate is located, $n_o$ denotes a refractive index of the birefringent structure for the ordinary light, and $n_e$ denotes a refractive index of the birefringent structure for the extraordinary light.

15. The display panel of claim 1, wherein the plurality of sub-pixels comprise light-emitting units of N colors, and the display panel comprises N−1 image motion units, wherein N is an integer greater than or equal to 3.

16. The display panel of claim 1, wherein a distance $d_1$ between adjacent sub-pixels and a subpixel period $d_2$ satisfy $0 \leq d_1/d_2 \leq 0.9$, wherein $d_1$ denotes a distance between adjacent sides of the adjacent sub-pixels, and $d_2$ denotes a sum of $d_1$ and a width of one sub-pixel in an extension direction of $d_1$.

17. A display method, applicable to a display panel, wherein the display panel comprises:

a substrate;

a display function layer disposed on one side of the substrate, and wherein the display function layer comprises a plurality of sub-pixels;

at least two image motion units, disposed on a light-emitting side of the display panel and sequentially arranged in a direction perpendicular to a plane where the substrate is located;

wherein a frame unit is used for the display panel to display a display picture, and the frame unit comprises at least three subframes; wherein when the display picture of the display panel is switched from a current subframe to a next subframe, the at least two image motion units are configured to move an outgoing position of an outgoing light of at least one of the plurality of sub-pixels to an outgoing position of another sub-pixel emitting a different color of light at the current subframe;

wherein the method comprises:

dividing a frame unit of a display picture into at least three subframes;

when the display picture of the display panel is switched from a current subframe to a next subframe, moving, by the at least two image motion units, an outgoing position of outgoing light of at least one of the plurality of sub-pixels to an outgoing position of another pixel emitting a different color of light at the current subframe.

18. The display method of claim 17, wherein the display function layer comprises the plurality of sub-pixels emitting three different colors of light, the display panel comprises two image motion units, and wherein each of the two image motion units comprises a light valve and a birefringent structure;

wherein optical axes of birefringent structures in the two image motion units are parallel, the light valve is switchable between a first state and a second state, wherein first polarized light in a first polarization direction passes through the light valve in the first state, and second polarized light in a second polarization direction passes through the light valve in the second state, wherein the first polarization direction is perpendicular to the second polarization direction; and the birefringent structure is disposed on one side of the light valve facing away from the light-emitting side of the display panel, the birefringent structure does not change an outgoing position of the first polarized light and moves an outgoing position of the second polarized light to an outgoing position of another sub-pixel emitting the different color of light at the current subframe; and wherein the method comprises:

dividing the frame unit of the display picture into three subframes;

in condition that a first subframe is displayed, controlling both light valves in the two image motion units to be in the first state;

in condition that a second subframe is displayed, controlling a light valve in one of the two image motion units to be in the first state, and controlling a light valve in the other of the two image motion units to be in the second state; and in condition that a third subframe is displayed, controlling both the light valves in the two image motion units to be in the second state.

19. The display method of claim 17, wherein the display function layer comprises the plurality of sub-pixels emitting three different colors of light, the display panel comprises two image motion units, and wherein each of the two image motion units comprises a light valve and a birefringent structure;

wherein optical axes of birefringent structures in the two image motion units are symmetrical about a first plane, wherein the first plane is located in the middle of the birefringent structures in the two image motion units and is parallel to the plane where the substrate is located; wherein an angle between the optical axes of the birefringent structures and the direction perpendicular to the plane where the substrate is located is greater than 0 degrees and less than 90 degrees; wherein the light valve is switchable between a first state and a second state, wherein first polarized light in a first polarization direction passes through the light valve in the first state, and second polarized light in a second polarization direction passes through the light valve in the second state, wherein the first polarization direction is perpendicular to the second polarization direction; and the birefringent structure is disposed on a light-emitting side of the light value, the birefringent structure does not change an outgoing position of the first polarized light and moves an outgoing position of the second polarized light to an outgoing position of another sub-pixel emitting the different color of light at the current subframe; and wherein the method comprises:

dividing the frame unit of the display picture into three subframes;

in condition that a first subframe is displayed, controlling both light valves in the two image motion units to be in the first state;

in condition that a second subframe is displayed, controlling a light valve in one of the two image motion units to be in the first state, and controlling a light valve in the other of the two image motion units to be in the second state; and in condition that a third subframe is displayed, controlling the light valve in the one of the two image motion units in the first state, and controlling the light valve in the other of the two image motion units in the second state, wherein a sane light value is in different states at the second subframe and the third subframe.

20. The display method of claim 17, wherein the display function layer comprises the plurality of sub-pixels emitting four different colors of light, the display panel comprises three image motion units, and wherein each of the three image motion units comprises a light valve and a birefringent structure; optical axes of birefringent structures in the three image motion units are parallel; the light valve is switchable between a first state and a second state, wherein first polarized light in a first polarization direction passes through the light valve in the first state, and second polarized light in a second polarization direction passes through the light valve in the second state, wherein the first polarization direction is perpendicular to the second polarization direction; and the birefringent structure is disposed a light-emitting side of the light value, the birefringent structure does not change an outgoing position of the first polarized light and moves an outgoing position of the second polarized light to an outgoing position of another sub-pixel emitting the different color of light at the current subframe; and wherein the method comprises:

dividing the frame unit of the display picture into four subframes;

in condition that a first subframe is displayed, controlling all light valves in the three image motion units to be in the first state;

in condition that a second subframe is displayed, controlling a light valve in one of the three image motion units to be in the first state, and controlling light valves in other two of the three image motion units to be in the second state;

in condition that a third subframe is displayed, controlling light valves in two of the three image motion units to be in the first state, and controlling a light valve in another one of the three image motion units to be in the second state; and in condition that a fourth subframe is displayed, controlling all the light valves in the three image motion units to be in the second state.

21. A display device, comprising a display panel, wherein the display panel comprises:

a substrate;

a display function layer disposed on one side of the substrate, and wherein the display function layer comprises a plurality of sub-pixels; and at least two image motion units, disposed on a light-emitting side of the display panel and sequentially arranged in a direction perpendicular to a plane where the substrate is located;

wherein a frame unit is used for the display panel to display a display picture, and the frame unit comprises at least three subframes: wherein when the display picture of the display panel is switched from a current subframe to a next subframe, the at least two image motion units are configured to move an outgoing position of an outgoing light of at least one of the plurality of sub-pixels to an outgoing position of another sub-pixel emitting a different color of light at the current subframe.

* * * * *